United States Patent
Saito

(10) Patent No.: US 6,752,291 B2
(45) Date of Patent: Jun. 22, 2004

(54) COMPONENT FEEDING METHOD, COMPONENT FEEDING APPARATUS, AND COMPONENT FEEDING UNIT

(75) Inventor: Koji Saito, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 128 days.

(21) Appl. No.: 10/107,357

(22) Filed: Mar. 28, 2002

(65) Prior Publication Data

US 2002/0141853 A1 Oct. 3, 2002

(30) Foreign Application Priority Data

Mar. 29, 2001 (JP) ........................................ 2001-097458

(51) Int. Cl.[7] .............................................. H05K 13/02
(52) U.S. Cl. ........................ 221/278; 221/164; 221/210; 221/211
(58) Field of Search ................................. 221/210, 211, 221/278, 164, 165, 247, 251, 272, 274; 198/689.1

(56) References Cited

U.S. PATENT DOCUMENTS

| | | | | |
|---|---|---|---|---|
| 4,953,749 A | * | 9/1990 | Kubota et al. | 221/168 |
| 5,570,812 A | * | 11/1996 | Ando et al. | 221/233 |
| 6,041,964 A | * | 3/2000 | Tokarz et al. | 221/211 |
| 6,089,796 A | * | 7/2000 | Ando et al. | 406/137 |
| 6,135,264 A | * | 10/2000 | Saito et al. | 198/396 |
| 6,253,902 B1 | * | 7/2001 | Saito et al. | 198/396 |
| 6,283,325 B1 | * | 9/2001 | Saito et al. | 221/200 |
| 6,296,104 B1 | * | 10/2001 | Ito et al. | 198/468.5 |
| 6,336,843 B2 | * | 1/2002 | Nakagawa et al. | 451/28 |
| 6,443,669 B2 | * | 9/2002 | Saito | 406/28 |
| 6,471,094 B2 | * | 10/2002 | Saito et al. | 221/278 |

OTHER PUBLICATIONS

Japan Patent Abstract Application No. 63–006932, filed Jan. 18, 1998, Publication No. 01–183200 date of publication Jul. 20, 1989.

* cited by examiner

*Primary Examiner*—Douglas A. Hess
(74) *Attorney, Agent, or Firm*—Lowe Hauptman Gilman & Berner, LLP

(57) ABSTRACT

A component feeding material is useful for taking a forefront electronic component outside from electronic components transferred in alignment. The electronic components are transferred forward in alignment along a transfer passage such that the forefront electronic component abuts against a component stopper, and when the forefront electronic component is taken outside through a component ejection port, air pressure for relieving pressing force is exerted rearward on at least one of following electronic components, thereby relieving the pressing force exerted on the forefront electronic component abutting against the component stopper from the following electronic components.

34 Claims, 15 Drawing Sheets

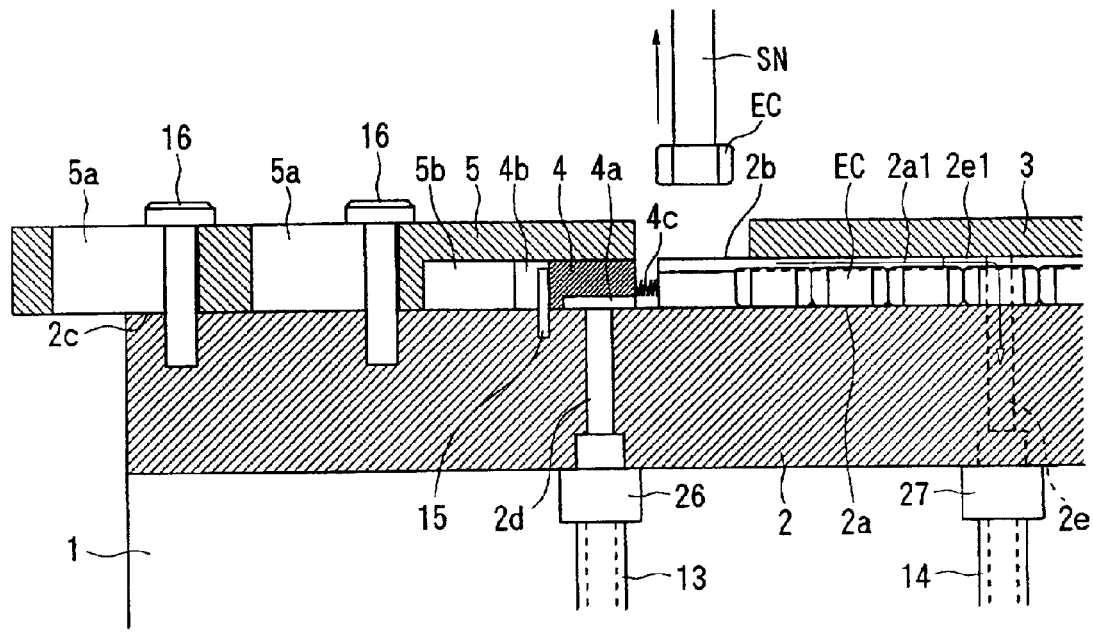
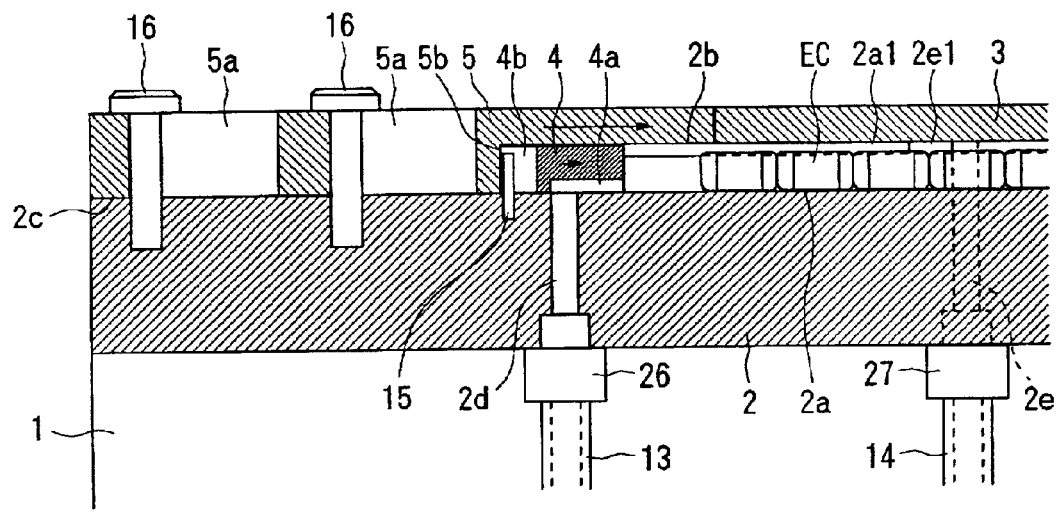

COMPONENT FEEDING METHOD, COMPONENT FEEDING APPARATUS, AND COMPONENT FEEDING UNIT

BACKGROUND OF THE INVENTION (i) Field of the Invention

The present invention relates to a component feeding method, a component feeding apparatus, and a component feeding unit, which are useful for taking out a forefront electronic component of electronic components such as chip components transferred in alignment.

(ii) Description of the Related Art

Japanese Patent Publication No. H1-183200 discloses an apparatus for transferring chip components by air suction force. The apparatus has a tubular feed path, an opening for taking out a component, which is provided at an end portion of the feed path, a stopper pin for positioning the forefront chip component at the opening, an air suction hole provided at a position spaced forward from the forefront chip component which came into contact with the stopper pin, and a shutter for opening and closing the opening.

The apparatus makes it possible to transfer chip components in the feed path forward by sucking air from a front side of the feed path with the opening being closed by the shutter and to allow the forefront chip component to come into contact with the stopper pin. The forefront chip component is taken out from the opening by a suction nozzle after the air suction is stopped and the shutter is moved to open the opening.

In the aforementioned apparatus, when the chip components in the feed path are transferred forward by air suction, a number of chip components are lined up in a pressed state after the forefront chip component abutting against the stopper pin, and under the influence thereof, the forefront chip component is in a state in which it is pressed forward by the following chip components. As a result, when the forefront chip component is taken out by the suction nozzle, there arise the disadvantage that the posture of the forefront chip component is disturbed and the disadvantage that the forefront chip component cannot be taken out. These disadvantages also occur in the same manner when the chip components in the feed path are transferred forward by blowing air from a rear side of the feed path.

The aforementioned disadvantages are considered to be eliminated by adopting the stopper pin movable forward and backward as the aforementioned stopper pin and advancing the stopper pin by a predetermined distance at the step before the forefront chip component is taken out, but only advancing the stopper pin a little cannot eliminate the aforementioned disadvantages. In order to eliminate the above-described disadvantages, it is necessary to advance the stopper pin to a large extent up to the position where the pressure force exerted on the forefront chip component can be eliminated, but since the pressure force exerted on the forefront chip component is not constant at each component transfer, the advancing distance of the forefront chip component when the stopper pin is advanced cannot be controlled, and as a result, the position of the forefront chip component varies, which makes it difficult to take out the forefront chip component by the suction nozzle.

SUMMARY OF THE INVENTION

An object of the present invention is to provide a component feeding method, a component feeding apparatus and a component feeding unit, which can take out the forefront electronic component in a favorable condition without causing a poor posture after electronic components are transferred in alignment.

In order to achieve this object, the feeding method of the present invention is a component feeding method for transferring electronic components forward in alignment along a transfer passage such that the forefront electronic component abuts against a component stopper in order to take the forefront electronic component outside through a component ejection port, and when the forefront electronic component is taken outside through the component ejection port, air pressure for relieving pressing force is exerted rearward on at least one of the following electric components.

According to this component feeding method, when the forefront electronic component is taken outside through the component ejection port, air pressure for relieving pressing force is exerted rearward on at least one of the following electronic components, whereby the pressing force exerted on the forefront electronic component abutting against the component stopper from the following electronic components can be relieved. Consequently, the disadvantage that the posture of the forefront chip component is disturbed when the forefront chip component is taken out by the suction nozzle, and the disadvantage that the forefront chip component cannot be taken out can be eliminated.

The component feeding apparatus of the present invention is a component feeding apparatus including a transfer passage for transferring electronic components forward in alignment, a component stopper against which the forefront electronic component abuts, and a component ejection port for taking the forefront electronic component outside, and includes an air hole for exerting air pressure for relieving pressing force rearward on at least one of following electric components when the forefront electronic component is taken outside through the component ejection port.

According to this component feeding apparatus, when the forefront electronic component is taken outside, the air pressure is exerted rearward on at least one of the following electronic components through the air hole for relieving pressing force, whereby the aforementioned component feeding method can be carried out properly.

The component feeding unit of the present invention includes a component guide having a linear channel for a transfer passage, a cover for covering a top surface of a part where the linear channel of the component guide is formed except for a front portion by which a component ejection port from which an forefront electronic component is taken outside is constituted, a component stopper movable to a component stop position in contact with a front end surface of the linear channel and to a separation position away from the component stop position, a shutter movable to a component ejection port closed position at which the component ejection port is covered and to a component ejection port open position away from the component ejection port closed position, a first air hole for transferring electronic components, formed forward from the front end of said linear channel and communicating with a transfer passage, and a second air hole for relieving pressing force, formed rearward from the front end of said linear channel and communicating with the transfer passage.

According to this component feeding unit, the unitized mechanism part can be separately assembled, and therefore the aforementioned feeding apparatus can be easily assembled. The unitized mechanism part can be removed from the feeding apparatus and replaced with other one, and therefore maintenance can be facilitated. Further, only the unitized mechanism part can be on the market.

The aforementioned object, other objects, features and advantages of the present invention will become apparent upon reading the following explanation and the accompanying drawings.

BRIEF DESCRIPTION OF THE DRAWINGS

FIG. 8 is a view showing a state in which an forefront electronic component is taken out by a suction nozzle;

FIG. 9 is a view showing a state in which a shutter is retreating;

DESCRIPTION OF THE PREFERRED EMBODIMENTS

Figure 1:
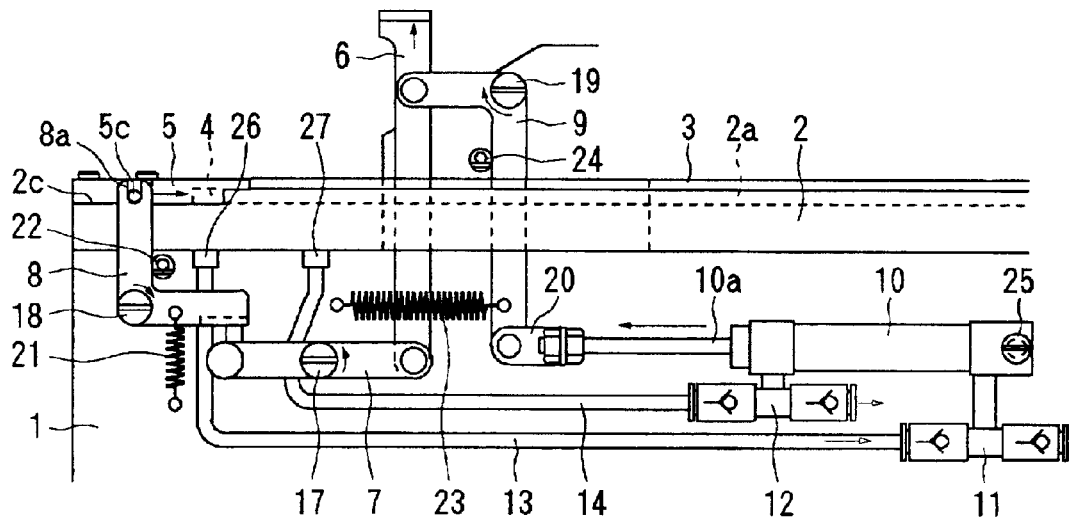
FIG. 1 is a left side view of a feeding apparatus showing a state in which an operation lever is at an ascending position, according to a first embodiment of the present invention.

Preferred embodiments of the present invention will be explained with reference to the drawings below. In this explanation, the left in FIG. 1 is expressed as front, the right is expressed as rear, the front side is expressed as left, and the back side is expressed as right.

FIG. 1 to FIG. 11 show a first embodiment of a feeding apparatus to which the present invention is applied. In FIG. 1 to FIG. 11, reference numeral 1 denotes a frame, reference numeral 2 denotes a component guide, reference numeral 3 denotes a cover, reference numeral 4 denotes a component stopper, reference numeral 5 denotes a shutter, reference numeral 6 denotes an operation lever, reference numeral 7 denotes a first drive lever, reference numeral 8 denotes a driven lever, reference numeral 9 denotes a second drive lever, reference numeral 10 denotes an air cylinder, reference numeral 11 denotes a first control valve, reference numeral 12 denotes a second control valve, reference numeral 13 denotes a first air tube, and reference numeral 14 denotes a second air tube.

Figure 3:
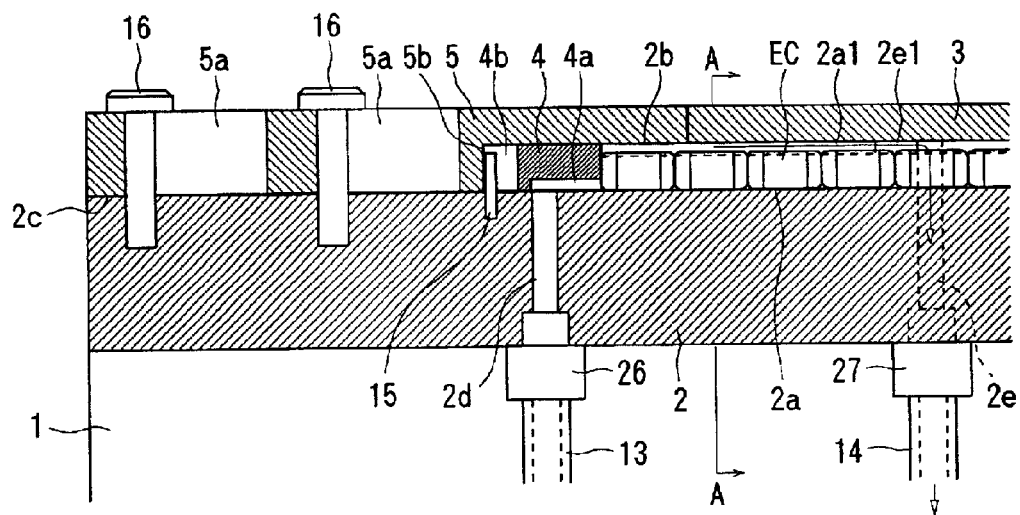
FIG. 3 is an essential part enlarged vertical longitudinal sectional view of FIG. 1.
Figure 4:
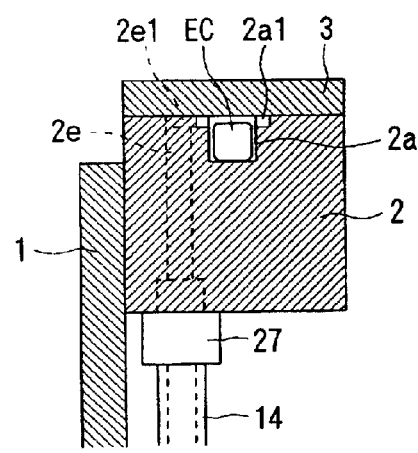
FIG. 4 is a sectional view taken along the line A—A of FIG. 3.

The component guide 2 has a linear channel with a rectangular longitudinal section, which becomes a transfer passage 2a for electronic components EC on its upper face, and has grooves with a rectangular longitudinal section being an auxiliary flow passage 2a1 for air along left and right opening edges at a front part of the linear channel. The upper surface of the part of the component guide 2 in which the linear channel is formed is covered with the cover 3 except for its front part, and the front part constitutes a component ejection port 2b from which the forefront electronic component EC can be taken out upward. With the component ejection port 2b being covered with a rear part of the shutter 5 as shown in FIG. 3, a front part of the aforementioned linear channel functions as the transfer passage 2a as the part covered with the cover 3, and front parts of the aforementioned left and right grooves function as the auxiliary flow passage 2a1 as the part covered with the cover 3. A recessed part 2c for placing the shutter 5 therein is formed at a front side part of the aforementioned linear channel of the component guide 2, and the depth dimension of the recessed part 2c corresponds to the depth dimension of the aforementioned linear channel, whereby a bottom surface of the transfer passage 2a continues to a bottom surface of the recessed part 2c without any elevation change.

Since the transfer passage 2a is for transferring the electronic components EC in a square pole form having the dimensional relationship of the length dimension>width dimension=height dimension, the lateral dimension and the vertical dimension of the transfer passage 2a are set to be slightly larger than the width dimension and the height dimension of the electronic component EC. The vertical dimension of the auxiliary flow passage 2a1 is set to be smaller than the width and height dimension of the electronic component EC so that the electronic component EC in the transfer passage 2a does not enter the auxiliary flow passage 2a1. In the feeding apparatus of the first embodiment, two grooves constituting the auxiliary flow passage 2a1 extend rearward from a front end of the aforementioned linear channel, and they are closed at a distance of about four times the length of the electronic component EC from the front end of the aforementioned linear channel.

A first air hole 2d is formed to penetrate vertically at a forward side of the bottom face of the aforementioned recessed part 2c from the front end of the aforementioned linear channel. A second air hole 2e is formed to penetrate vertically at a position spaced about 4.5 times the length of the electronic component EC from the front end of the linear channel to be spaced rightward from the aforementioned linear channel. An upper end of the second air hole 2e communicates with a rear end of the right side groove and the linear channel through a communication flow passage 2e1 facing obliquely forward.

The component stopper 4 is formed into a rectangular parallelepiped shape having a vertical dimension substantially corresponding to the vertical dimension of the aforementioned transfer passage 2a and a smaller lateral dimension than the width dimension of the aforementioned component guide 2. A U-shaped recessed part with an opened rear end is formed on a bottom surface of the component stopper 4, and with the bottom surface of the component stopper 4 being in contact with the bottom surface of the aforementioned recessed part 2c, an airway 4a having a lateral dimension substantially corresponding to the lateral dimension of the auxiliary flow passage 2a1 is constructed by the aforementioned U-shaped recessed part. This component stopper 4 moves back and forth in synchronization with the shutter 4, and the aforementioned airway 4a always communicates with the first air hole 2d.

A guide channel 4b extending rearward from its front end is formed at a front part of the component stopper 4, and an upper protruded part of a positioning pin 15 vertically provided at the bottom surface of the recessed part 2c is inserted into the guide channel 4b. Specifically, advance of the component stopper 4 is restricted by the positioning pin 15, while retreat thereof is restricted by the front end surface of the aforementioned linear channel (the rear end surface of the recessed part 2c). Further, coil spring 4c for biasing the component stopper 4 forward is attached between the component stopper 4 and the rear end surface of the recessed part 2c.

The shutter 5 is formed into a rectangular parallelepiped shape having a vertical dimension substantially corresponding to the sum of the vertical dimension of the aforementioned transfer passage 2a and a thickness dimension of the cover 3 and having a lateral dimension substantially corresponding to the width dimension of the aforementioned component guide 2. Guide holes 5a extending in a longitudinal direction are each formed at two spots in the front and the rear at the shutter 5, and a lower part of a guide pin 16 inserted from above to each of the guide holes 5a is fixedly attached to the bottom surface of the aforementioned recessed part 2c.

A recessed part 5b having a depth dimension substantially corresponding to a depth dimension of the aforementioned transfer passage 2a and having a longitudinal dimension substantially corresponding to the sum of a longitudinal dimension of the aforementioned component ejection port 2b and a longitudinal dimension of the aforementioned component stopper 4 is formed at the rear lower surface of the shutter 5. The width of the front side portion of the recessed part 5b becomes narrow via a step 5b1, and a lateral dimension of the narrow-width portion is slightly larger than the lateral dimension of the component stopper 4. Further, an operation rod 5c capable of being inserted into an engaging groove 8a of the drive lever 8 is provided to face sideways at a left side surface of the shutter 5.

As shown in FIG. 1, FIG. 3, FIG. 9 and FIG. 10, with the rear end surface of the shutter 5 being in contact with the front end surface of the cover 3 and the rear part of the shutter 5 blocking the component ejection port 2b, the step 5b1 of the recessed part 5b is in contact with the rear end surface of the recessed part 2c, the front end surface of the recessed part 5b is in contact with the front end surface of the component stopper 4, and the rear end surface of the component stopper 4 is in contact with the rear end surface of the recessed part 2c.

The operation lever 6, the first drive lever 7, the driven lever 8 and the second drive lever 9 constitute a lever mechanism for operating the shutter 5 and the air cylinder 10 based on addition and release of power to the operating lever 6.

The first drive lever 7 is rotatably supported at its center by a support shaft 17 provided at the frame 1, the L-shaped driven lever 8 is rotatably supported at its bent portion by a support shaft 18 provided at the frame 1, and the L-shaped second drive lever 9 is rotatably supported at its bent portion by a support shaft 19 provided at the frame 1. A rear end of the first drive lever 7 is rotatably connected to a lower end of the operation lever 6, the front end of the second drive lever 9 is rotatably connected to an upper portion of the operation lever 6, a front end of a connecting plate 20 is rotatably connected to a lower end of the second drive lever 9, and a front end of a rod 10a of the air cylinder 10 is rotatably connected to a rear end of the connecting plate 20.

Figure 2:
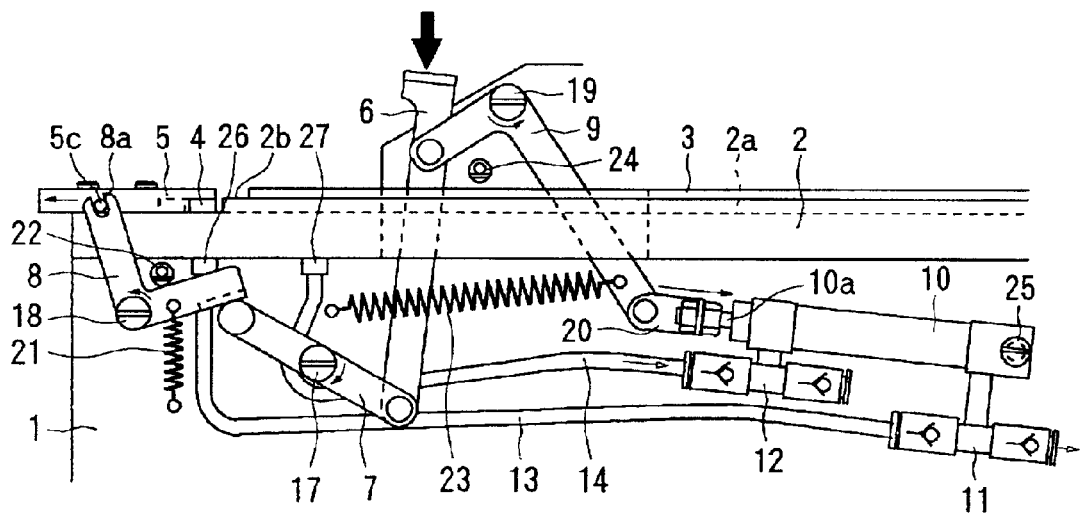
FIG. 2 is a left side view of the feeding apparatus showing a state in which the operation lever shown in FIG. 1 is at a descending position.

As understood from FIG. 1 and FIG. 2, the operation lever 6 and the second drive lever 9 are inserted through a clearance (no reference numeral) formed between the frame 1, and the component guide 2 and the cover 3. The front end of the first drive lever 7 and the rear end of the driven lever 8 face each other with a clearance between them, and when a rotational angle of the first drive lever 7 exceeds a predetermined angle, the front end of the first drive lever 7 pushes up the rear end of the driven lever 8.

The U-shaped engaging groove 8a is formed at an upper end of the driven lever 8, and the operation rod 5c of the shutter 5 is inserted in the engaging groove 8a. Further, the driven lever 8 is biased in a clockwise direction in FIG. 1 by a coil spring 21 provided to be stretched between the driven lever 8 and the frame 1, and the rotation in the clockwise direction is restricted by a positioning stopper 22. The second drive lever 9 is biased in the clockwise direction in FIG. 1 by a coil spring 23 provided to be stretched between the second drive lever 9 and the frame 1, and the rotation in the clockwise direction is restricted by a positioning stopper 24.

The air cylinder 10 is a double-acting type including two air supply and exhaust ports, and a rear part of it is rotatably supported by a support shaft 25 provided at the frame 1. A first control valve 11 is attached to the air supply and exhaust port at the rear side of the air cylinder 10, and a second control valve 12 is attached to the air supply and exhaust port at the front side. As understood from the valve marks shown in FIG. 1 and FIG. 2, when the rod 10a is retreated from an advancing position, a front side port of the second control valve 12 becomes an intake port, and a rear side port of the first control valve 11 becomes an exhaust port. When the rod 10a advances from a retreat position, a front side port of the first control valve 11 becomes an intake port, and a rear side port of the second control valve 12 becomes an exhaust port.

A rear end of the first air tube 13 is connected to the front side port of the aforementioned first control valve 11, and a front end of the first air tube 13 is connected to the first air hole 2d of the aforementioned component guide 2 via a first joint 26. A rear end of the second air tube 14 is connected to the front side port of the aforementioned second control valve 12, and a front end of the second air tube 14 is connected to the second air hole 2e of the aforementioned component guide 2 via a second joint 27.

In the feeding apparatus of the first embodiment, the front side port of the first control valve 11, the first air tube 13, the first joint 26, the first air hole 2d and the airway 4a constitute a first air route for transferring electronic components, and the front side port of the second control valve 12, the second air tube 14, the second joint 27, the second air hole 2e and the communication flow passage 2e1 constitute a second air route for relieving pressing force.

Though not shown in the drawings, a storeroom in which a number of electronic components EC are housed in a bulk state, and an aligning and feeding mechanism for aligning and feeding the electronic components EC in this storeroom to the rear end of the transfer passage 2a are provided at the rear end of the transfer passage 2a. The aligning and feeding mechanism is capable of taking intermittent action following addition and release of power to and from the aforementioned operation lever 6, or capable of taking intermittent action or continuous action by another drive mechanism, and based on these actions, it aligns and feeds the electronic components EC in the storeroom to the rear end of the transfer passage 2a. In this regard, as the electronic component EC, other than a chip component such as a chip condenser, a chip resister and a chip inductor, a composite component such as an LC filter, an array component such as a condenser array and an inductor array, and other kinds of electronic components can be appropriately used as long as it can be aligned and transferred.

The component transfer by the aforementioned feeding apparatus is performed by repeating, for example, about 0.1 seconds' cycle of the action of adding a force to the upper end of the operation lever 6 using a suitable drive device to move the operation lever 6 downward, and thereafter releasing a pushing-down force to the operation lever 6 to return the operation lever 6 by a biasing force of the coil spring 23, as shown in FIG. 1 and FIG. 2. The forefront electronic component EC is taken out in a state in which the operation lever 6 is at a descending position.

Figure 11:
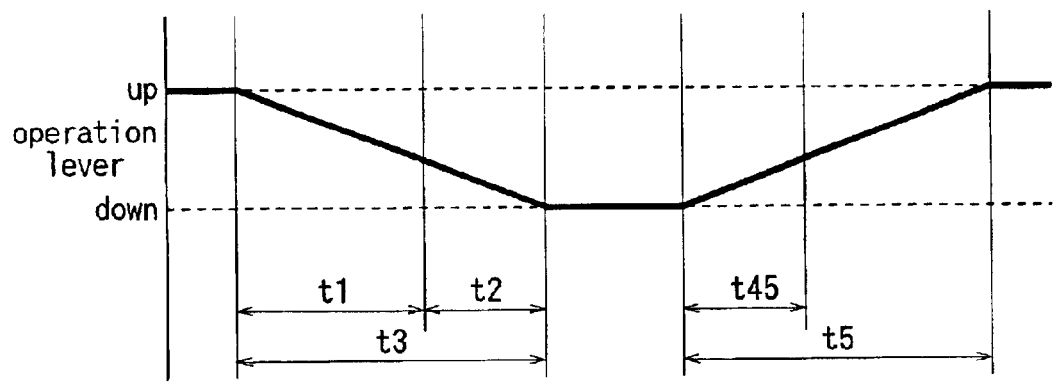
FIG. 11 is a timing chart of up-and-down movement of the operation lever of the feeding apparatus shown in FIG. 1.

FIG. 11 shows a timing chart of an up and down operation of the operation lever 6, and t1 in FIG. 11 shows a time from start of pushing down the operation lever 6 to start of the rotation of the driven lever 8, t2 shows a time from start of the rotation of the driven lever 8 to stop of the same, t3 shows a time from start of retreat of the rod 10a of the air cylinder 10 to stop of the same, t4 shows a time from releasing the pushing-down force onto the operation lever 6 to the return of the first drive lever 7 and the driven lever 8, and t5 shows a time from start of advance of the rod 10a of the air cylinder 10 to stop of the same.

When the operation lever 6 at an ascending position is moved downward, the first drive lever 7 rotates in the clockwise direction as shown in FIG. 2. And when the rotational angle of the first drive lever 7 exceeds a predetermined angle, the front end of the first drive lever 7 pushes up the rear end of the driven lever 8, and the driven lever 8 is rotated in a counterclockwise direction as shown in FIG. 2. The second drive lever 9 is rotated in the counterclockwise direction and the rod 10a of the air cylinder 10 is retreated from the advancing position as shown in FIG. 2.

Figure 5:
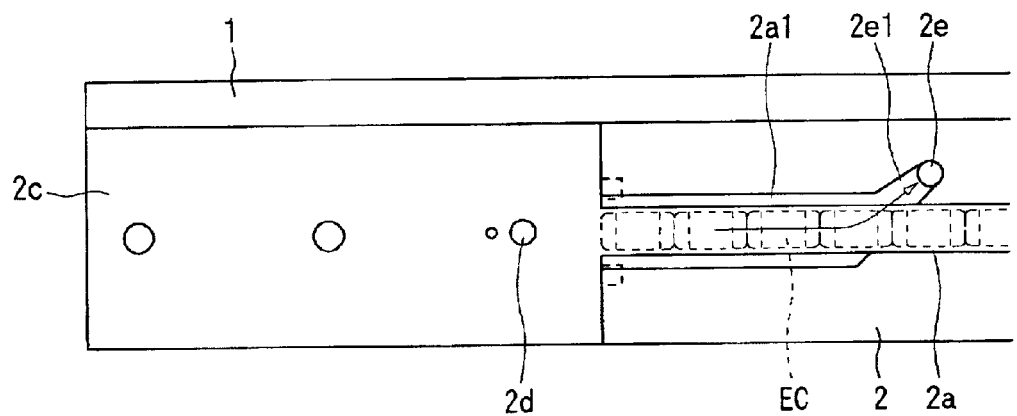
FIG. 5 is a top view excluding a cover, a stopper, a shutter, a positioning pin and a guide pin from FIG. 3.

When the rod 10a of the air cylinder 10 starts retreat in a state in which the previous component transfer is finished, specifically, in a state in which the shutter 5 is at a predetermined component ejection port closed position as shown in FIG. 3, the component stopper 4 is at a predetermined component stop position, the electronic components EC are aligned in a longitudinal direction inside the transfer passage 2a, and the forefront electronic component EC comes into contact with the component stopper 4, negative air pressure is exerted rearward on mainly the second to the fourth electronic components EC in the transfer passage 2a through the front side port of the second control valve 12, the second air tube 14, the second joint 27, the second air hole 2e and the communication flow passage 2e1, and a force drawing rearward is exerted on these electronic components EC as shown in FIG. 5. A number of electronic components EC are aligned in a pressed state behind the forefront electronic component EC abutting against the component stopper 4, and therefore even if negative air pressure is exerted rearward on the second to fourth electronic components EC, the electronic components EC and the electronic components EC behind them do not retreat to a large extent. However, when negative air pressure is exerted rearward on the second to fourth electronic components EC, the pressing force exerted on the forefront electronic component EC abutting against the component stopper 4 from the following electronic components EC is relieved, and the following electronic components EC basically become stationary on the spot, which includes the case in which the following electronic components EC slightly retreat.

Figure 6:
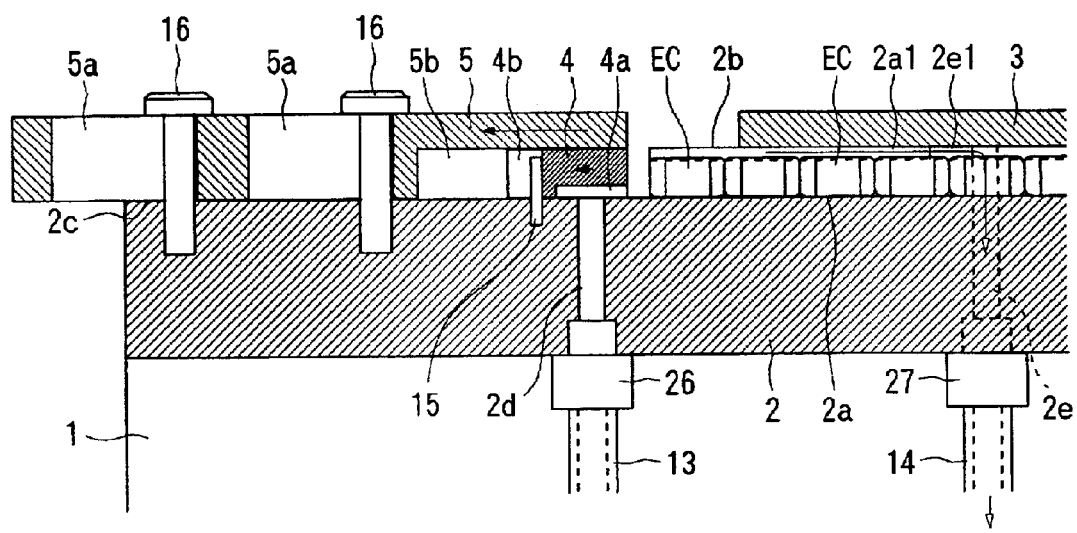
FIG. 6 is a view showing a state in which a shutter is advancing.
Figure 7:
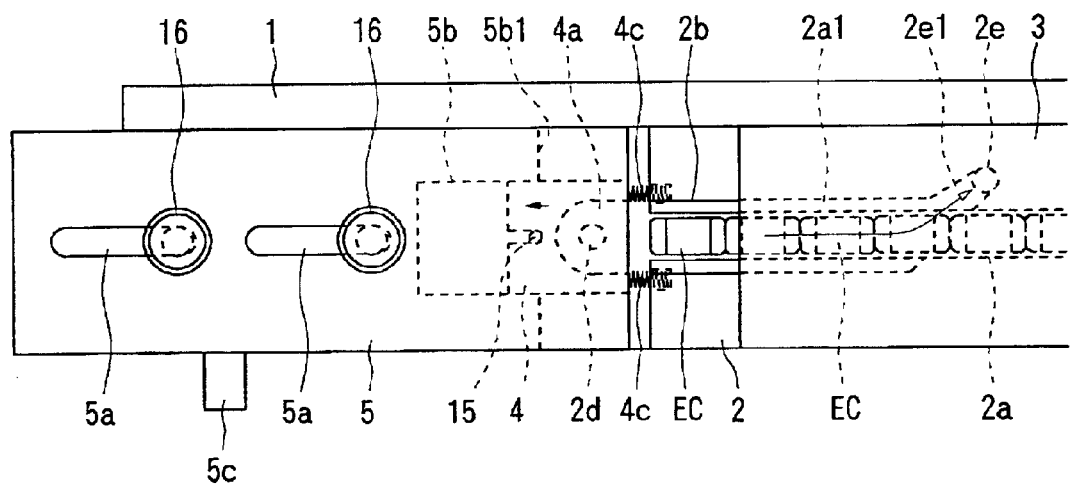
FIG. 7 is a top view of FIG. 5.

If the driven lever 8 starts rotation in the counterclockwise direction, delayed by time t1 from the start of the retreat of the rod 10a of the air cylinder 10, the shutter 5 starts advancing following the rotation of the driven lever 8, and the component stopper 4 also starts advancing by the biasing force of the coil spring 4c as shown in FIG. 6 and FIG. 7. Since the advance of the component stopper 4 is restricted by the positioning pin 15, it stops earlier when it reaches a predetermined separation position spaced at a very short distance forward from the component stop position, but the shutter 5 further advances until the rotation of the driven lever 8 stops and reaches a predetermined component ejection port open position.

When the component stopper 4 advances, the residual pressure at the time when negative air pressure is exerted forward on the electronic components EC in the transfer passage 2a through the first air hole 2d and the airway 4a on the previous component transfer does not remain in the airway 4a and the first air hole 2d, and if it remains, it is not sufficient for sucking the forefront electronic component EC. Consequently, the forefront electronic component EC does not advance and only the component stopper 4 advances as shown in FIG. 6 and FIG. 7. However, from the relation with response described later, when the aforementioned residual pressure remains in the airway 4a and the first air hole 2d and is sufficient to suck the forefront electronic component EC, the forefront electronic component EC advances with the component stopper 4 in a state in which it is attracted to the advancing component stopper 4, and is separated from the second electronic component EC.

At the point of time when the shutter 5 and the component stopper 4 start advancing, the rod 10a of the air cylinder 10 is still retreating. Accordingly, negative air pressure for relieving pressing force continues to be exerted rearward mainly on the second to the fourth electronic components EC in the transfer passage 2a and thereby the following electronic components EC keep standing still, and therefore when the component stopper 4 advances from the component stop position to the separation position, the pressing force added to the forefront electronic component EC is eliminated completely.

The aforementioned negative air pressure for relieving pressing force is not exerted on the second to the fourth electronic components EC in synchronization with the retreat of the rod 10a of the air cylinder 10, but actually, from the relation with response, the negative air pressure for relieving pressing force starts to work a little later than the start of the retreat of the rod 10a of the air cylinder 10, and it stops working a little later than the stop of the retreat of the rode 10a. In concrete, the negative air pressure for relieving pressing force starts to work just before the shutter 5 starts to advance, and it does not work just after the forefront electronic component EC is taken out.

Further, when the shutter 5 starts advancing and a clearance is formed between the rear end surface of the shutter 5 and the front end surface of the cover 3, outside air entering from this clearance enters the second air hole 2e through the transfer passage 2a, the auxiliary flow passage 2a1 and the communication flow passage 2e1, but the apparatus has the structure which makes it difficult for outside air to enter the second air hole 2e, whereby negative air pressure for relieving pressing force exerted rearward on the second to the fourth electronic components EC is not reduced so much, and the following electronic components EC remain at rest.

The forefront electronic component EC is taken outside with the operation lever 6 being at the descending position, specifically, with the shutter 5 being at a predetermined component ejection port open position and the component stopper 4 being at the predetermined separation position. In concrete, as shown in FIG. 8, a suction nozzle SN descends from above the component ejection port 2b, and sucks the forefront electronic component EC, and the forefront electronic component EC after being sucked is taken outside through the component ejection port 2b. The forefront electronic component EC taken out by the suction nozzle SN is mounted on, for example, a substrate or the like.

As explained above, the negative air pressure for relieving pressing force still works at the point of time when the forefront electronic component EC is taken out, and therefore when the forefront electronic component EC is taken out, the following electronic components EC remain at rest.

When the pressing force to the operation lever 6 is released to return the operation lever 6 at the descending position after the forefront electronic component EC is taken out, the first drive lever 7 rotates in the counterclockwise direction and returns, and the driven lever 8 is rotated in the clockwise direction by the biasing force of the coil spring 21 and returns as shown in FIG. 1. The second drive lever 9 is rotated in the clockwise direction and returns, and the rod 10a of the air cylinder 10 advances from the retreat position and returns as shown in FIG. 1.

When the first drive lever 7 and the driven lever 8 start rotation in the counterclockwise direction after the forefront electronic component EC is taken out, the shutter 5 starts retreating following the rotation of the driven lever 8, and after the retreating shutter 5 contacts the component stopper 4, the component stopper 4 retreats with the shutter 5 as shown in FIG. 9. The shutter 5 stops retreating when the rear end surface thereof is in contact with the front end surface of the cover 3, and the component stopper 4 stops retreating when the rear end surface is in contact with the rear end surface of the recessed part 2c.

Figure 10:
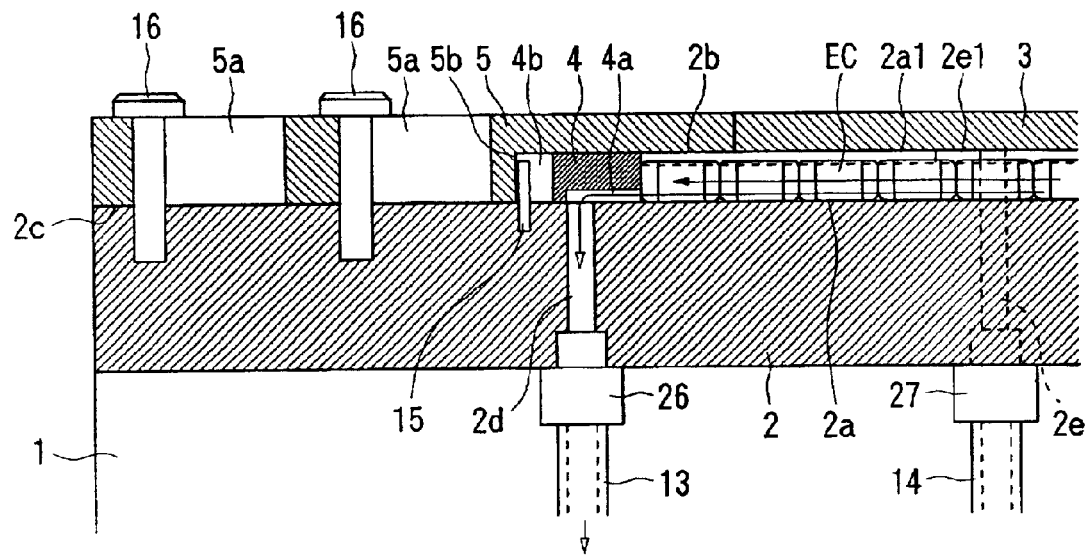
FIG. 10 is a view showing a state in which electronic components in a transfer passage are transferred.

When the rod 10a of the air cylinder 10 starts advancing, negative air pressure is exerted forward on the electronic components EC in the transfer passage 2a through the front side port of the first control valve 11, the first air tube 13, the first joint 26, the first air hole 2d and the airway 4a and force to draw forward is exerted on the electronic components EC in the transfer passage 2a, until the rod 10a stops advancing as shown in FIG. 10. As a result, the electronic components EC in the transfer passage 2a are transferred forward in alignment, and the forefront electronic component EC abuts against the component stopper 4.

The aforementioned negative air pressure for transferring electronic components does not work on the electronic components EC in the transfer passage 2a in synchronization with the advance of the rod 10a of the air cylinder 10, but actually, from the relation with response, the negative air pressure for transferring the electronic components starts to work a little later than the start of the advance of the rod 10a of the air cylinder 10, and it stops working a little later than the stop of the advance of the rod 10a. In concrete, the negative air pressure for transferring the electronic components starts to work at a point of the time when, or before or after the shutter 5 returns, and it stops working after the rod 10a stops advancing.

According to the feeding apparatus of the first embodiment, when the forefront electronic component EC is taken outside through the component ejection port 2b, the negative air pressure is exerted rearward mainly on the second to the fourth electronic components EC in the transfer passage 2a through the second air hole 2e and the communication flow passage 2e1, whereby the pressing force exerted on the forefront electronic component EC abutting against the component stopper 4 from the following electronic components EC is relieved, and the following electronic components EC can be basically kept at rest, which includes the case when they are slightly retreated. By moving the component stopper 4 forward from the component stop position to the separation position while keeping the following electronic components EC at rest, the pressing force added to the forefront electronic component EC can be completely eliminated. Accordingly, when the forefront electronic component EC is taken out by the suction nozzle SN, the disadvantage that the posture of the forefront electronic component EC is disturbed and the disadvantage that the forefront electronic component EC cannot be taken out are surely eliminated, and the forefront electronic component EC after transferred in alignment can be taken out in a favorable state without disturbance occurring to its posture.

The pressing force exerted on the forefront electronic component EC from the following electronic components EC can be relieved in a state before the component stopper 4 starts advancing, and therefore even when a fixed type of stopper which does not move from the component stop position is used as the component stopper 4, the same operational effects as described above can be obtained.

Since the component stopper 4 is advanced from the component stop position to the separation position with the following electronic components EC being kept at rest, even when the forefront electronic component EC is inclined at the point of time when the forefront electronic component EC comes into contact with the component stopper 4, the inclination is automatically corrected when the component stopper 4 advances, and the forefront electronic component EC can be taken out while it is in a stable posture.

Figure 12:
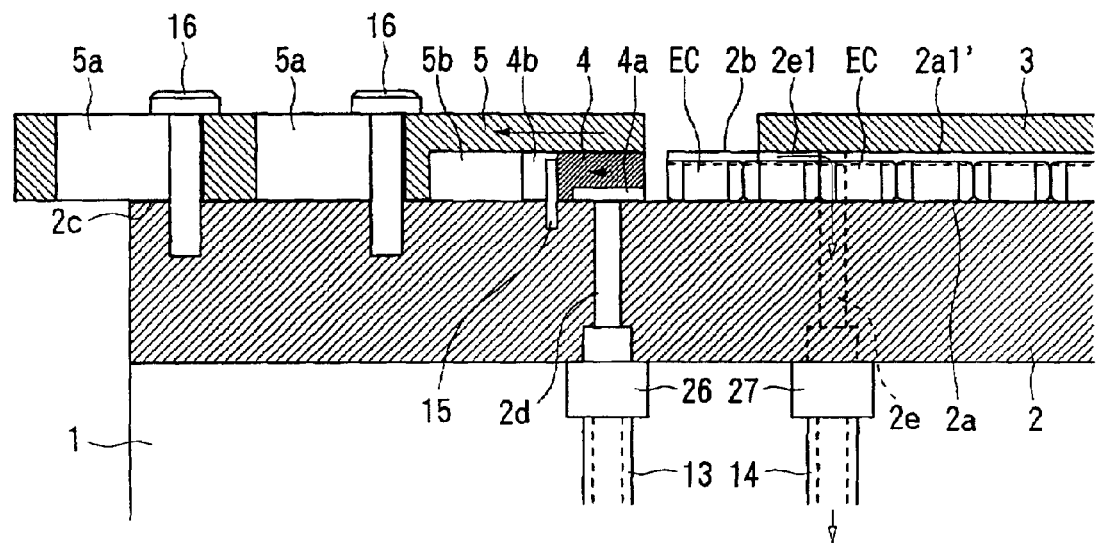
FIG. 12 is a view showing a state in which a shutter is advancing, according to a second embodiment of the present invention.
Figure 13:
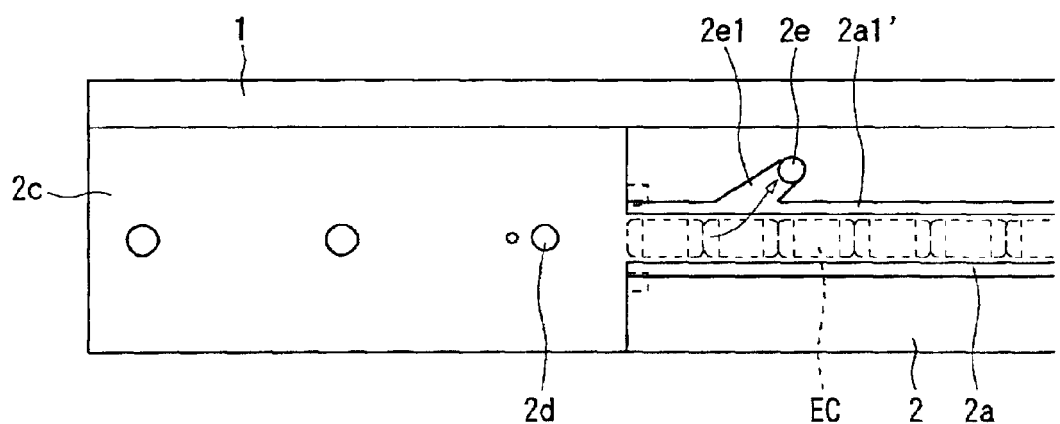
FIG. 13 is a top view excluding a cover, a stopper, a shutter, a positioning pin and a guide pin from FIG. 12.

FIG. 12 and FIG. 13 show a second embodiment of the feeding apparatus to which the present invention is applied. The points in which this feeding apparatus differs from the feeding apparatus of the first embodiment are that the groove with a rectangular longitudinal section to be an auxiliary flow passage 2a1' is extended to the rear, and that the position of the second air hole 2e is displaced to the position of about twice the length dimension of the electronic component EC from the front end of the aforementioned linear channel, and the upper end thereof is made to communicate with the right side groove through the communication flow passage 2e1.

According to the feeding apparatus of the second embodiment, negative air pressure for relieving pressing force is exerted rearward mainly on the second electronic component EC in the transfer passage 2a through the second air hole 2e and the communication flow passage 2e1, and thereby the following electronic components EC can be kept standing on the spot, thus making it possible to obtain the same operational effects as in the feeding apparatus of the first embodiment.

The position of the second air hole 2e may be any position if only negative air pressure for relieving pressing force can be exerted rearward on at least one of the following electronic components EC. The same operational effects as in the feeding apparatus of the first embodiment can be also obtained if the second air hole 2e is formed at the position where negative air pressure for relieving pressing force can be exerted rearward for example, on the second and the third electronic components EC, a plurality of electronic components EC from the second to the nth (n≧5), the third electronic component EC, a plurality of electronic components EC from the third to the nth (n≧4), or a plurality of electronic components EC from the fourth to the nth (n≧5).

Figure 14:
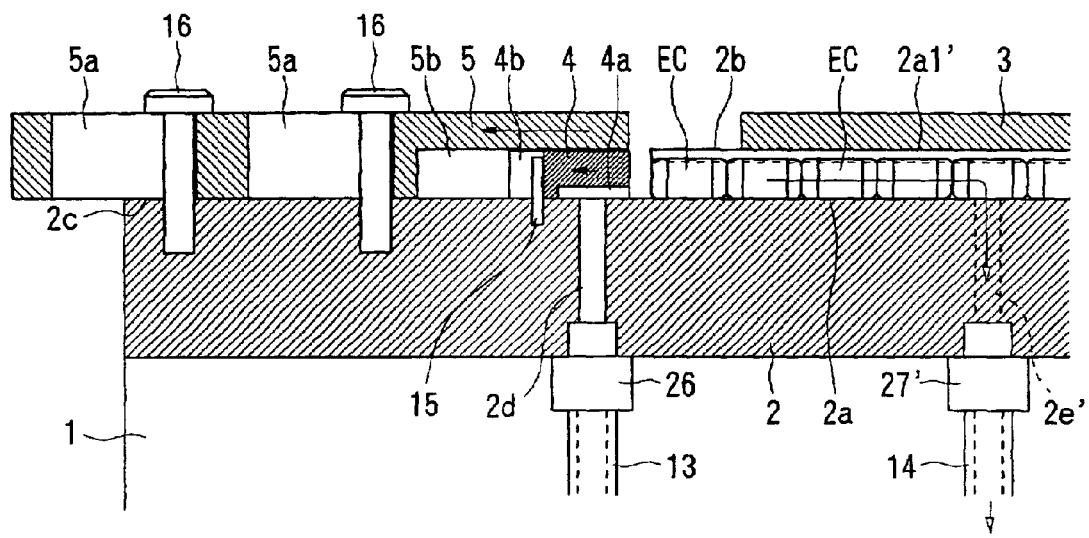
FIG. 14 is a view showing a state in which a shutter is advancing, according to a third embodiment of the present invention.
Figure 15:
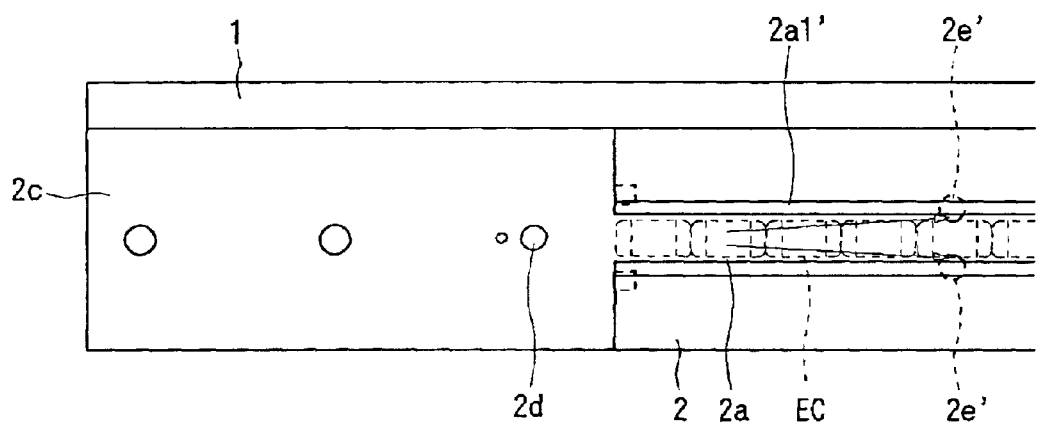
FIG. 15 is a top view excluding a cover, a stopper, a shutter, a positioning pin and a guide pin from FIG. 14.

FIG. 14 and FIG. 15 show a third embodiment of the feeding apparatus to which the present invention is applied. The points in which the feeding apparatus differs from the feeding apparatus of the first embodiment are that the groove with a rectangular longitudinal section to be an auxiliary flow passage 2a1' is extended to the rear, that through-holes with part of their upper end openings are exposed to the bottom surfaces are formed at the left and right positions of the bottom surface of the transfer passage 2a, which are made to be second air holes 2e', and that a joint in which suction air from two of the second air holes 2e' can join each other is used as a second joint 27'.

According to the feeding apparatus of the third embodiment, negative air pressure for relieving pressing force is exerted rearward mainly on the second to the fifth electronic components EC in the transfer passage 2a through the two second air holes 2e' provided on the bottom surface of the transfer passage 2a, and the following electronic components EC can be kept standing still on the spot, thus making it possible to obtain the same operational effects as in the feeding apparatus of the first embodiment.

The position of the second air hole 2e' may be any position if only negative air pressure for relieving pressing force can be exerted rearward on at least one of the following electronic components EC. The same operational effects as in the feeding apparatus of the first embodiment can be also obtained if the second air hole 2e' is formed at the position where negative air pressure for relieving pressing force can be exerted rearward for example, on the second and the third electronic components EC, a plurality of electronic components EC from the second to the nth (n≧5), the third electronic component EC, a plurality of electronic components EC from the third to the nth (n≧4), or a plurality of electronic components EC from the fourth to the nth (n≧5). If the auxiliary flow passage 2a1' does not exist, the second air hole 2e' and the transfer passage 2a can communicate with each other, and therefore the auxiliary flow passage 2a1' in this feeding apparatus is not necessarily required.

Figure 16:
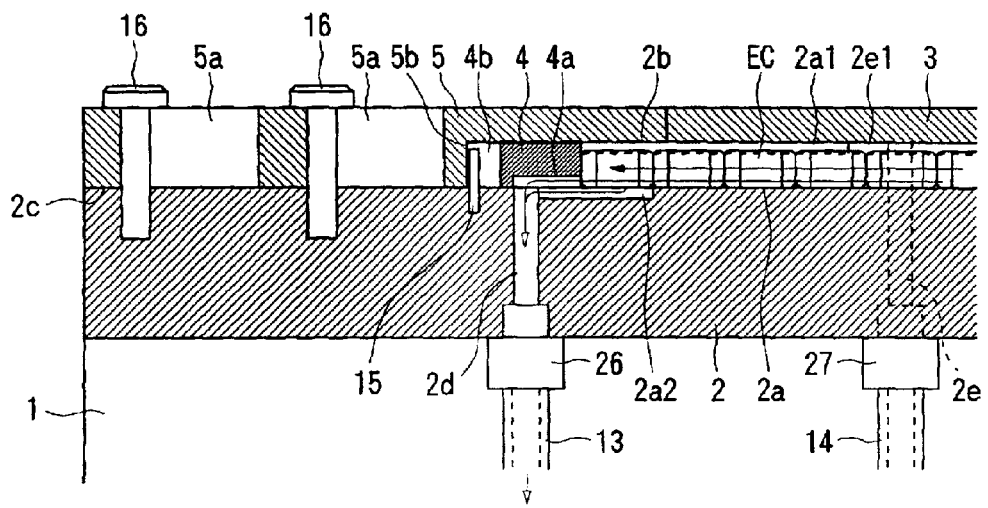
FIG. 16 is a view showing a state in which electronic components in a transfer passage are transferred, according to a fourth embodiment of the present invention.
Figure 17:
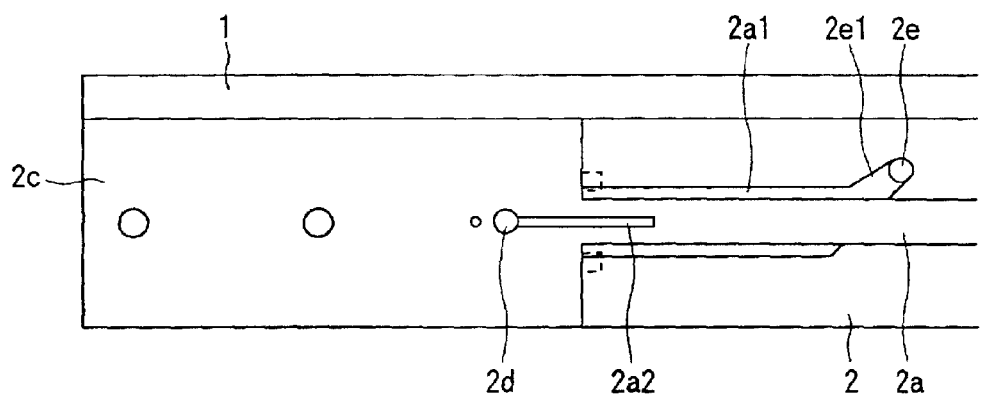
FIG. 17 is a top view excluding a cover, a stopper, a shutter, a positioning pin and a guide pin from FIG. 16.

FIG. 16 and FIG. 17 show a fourth embodiment of the feeding apparatus to which the present invention is applied. The point in which the feeding apparatus differs from the feeding apparatus of the first embodiment is that a linear channel having a smaller width dimension than the electronic component EC is formed to have the length dimension from the first air hole 2d to the rear end of the electronic component EC on the bottom surface of the transfer passage 2a and the bottom surface of the recessed part 2c, and this is made an auxiliary flow passage 2a2.

According to the feeding apparatus of the fourth embodiment, negative air pressure exerted through the airway 4a of the component stopper 4 is exerted on the electronic component EC in the transfer passage 2a, whereby the components can be transferred, and negative air pressure exerted through the auxiliary flow passage 2a2 is exerted on a lower surface of the forefront electronic component EC, whereby its posture can be corrected.

Figure 18:
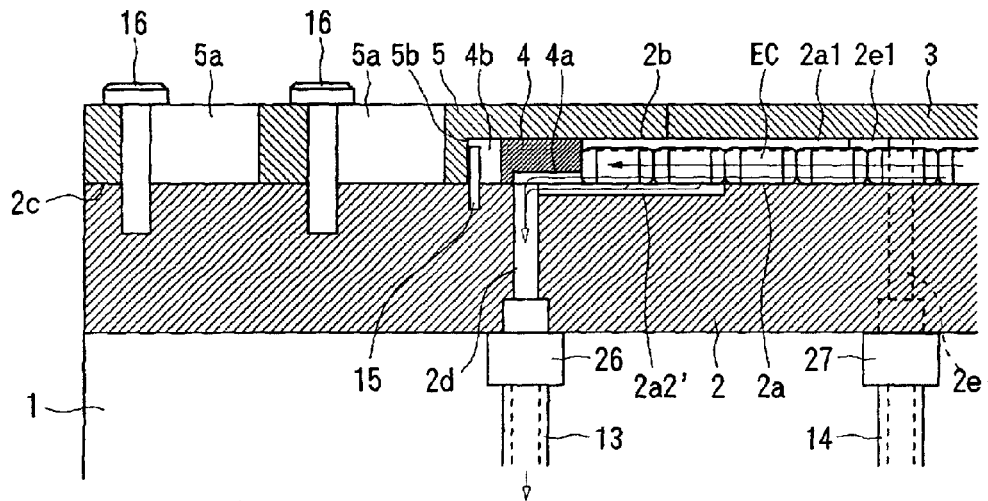
FIG. 18 is a view showing a modification example of an auxiliary flow passage shown in FIG. 16 and FIG. 17.

The length dimension of the aforementioned auxiliary flow passage 2a2 can be appropriately changed, and as shown in FIG. 18, the linear channel having the length dimension from the first air hole 2d to the rear end of the second electronic component EC is used as the auxiliary flow passage 2a2' to make it possible to correct the postures of the forefront electronic component EC and the second electronic components EC, or the channel having longer length dimension than this may be used as an auxiliary flow passage to make it possible to correct the postures of more than three electronic components including the forefront electronic component EC.

Figure 19:
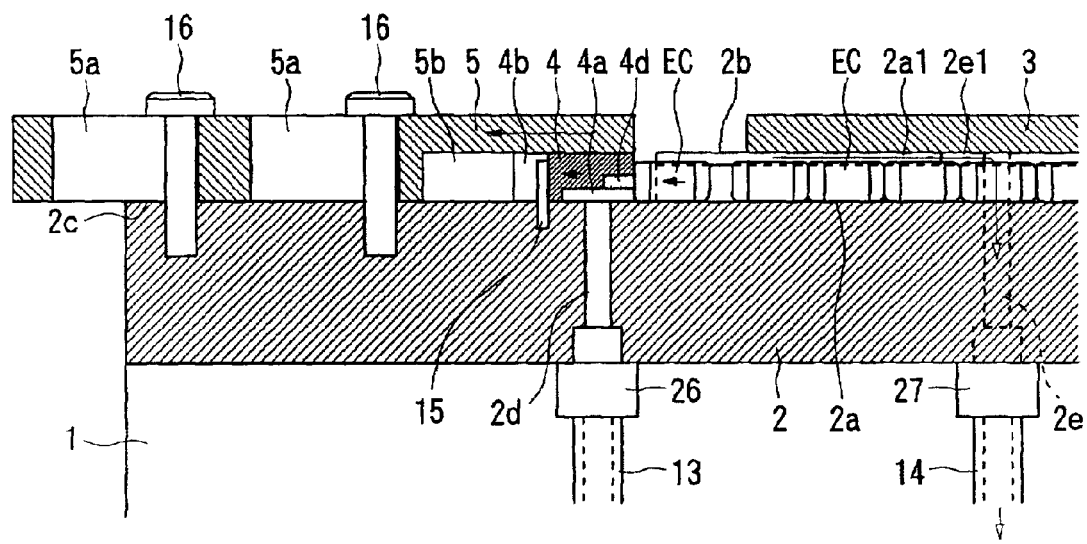
FIG. 19 is a view showing a state in which a shutter is advancing, according to a fifth embodiment of the present invention.
Figure 20:
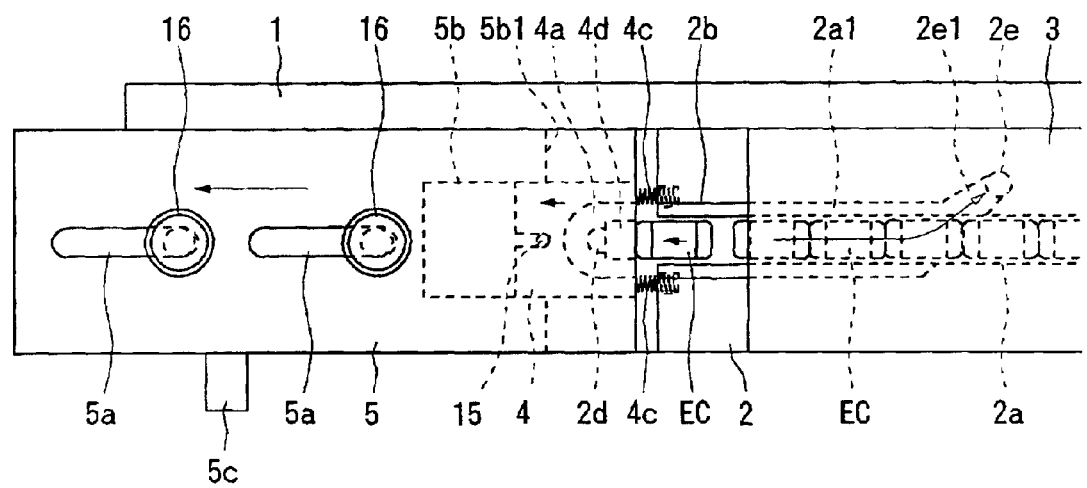
FIG. 20 is a top view of FIG. 19.

FIG. 19 and FIG. 20 show a fifth embodiment of the feeding apparatus to which the present invention is applied. The point in which this feeding apparatus differs from the feeding apparatus of the first embodiment is that the component stopper 4 is provided with a permanent magnet 4d composed of samarium-cobalt magnet or the like, and the forefront electronic component EC is attracted to the component stopper 4 by this permanent magnet 4d.

According to the feeding apparatus of the fifth embodiment, the forefront electronic component EC abutting against the component stopper 4 can be attracted to the component stopper 4 by magnet force of the permanent magnet 4d, and therefore the forefront electronic component EC is advanced with the component stopper 4 when the component stopper 4 advances, whereby the forefront electronic component EC is positively separated from the following electronic component EC. If a permanent magnet having minimum required magnet force is used as the permanent magnet 4d, the aforementioned magnet force never becomes interference when the forefront electronic component EC is taken out with the suction nozzle.

Figure 21:
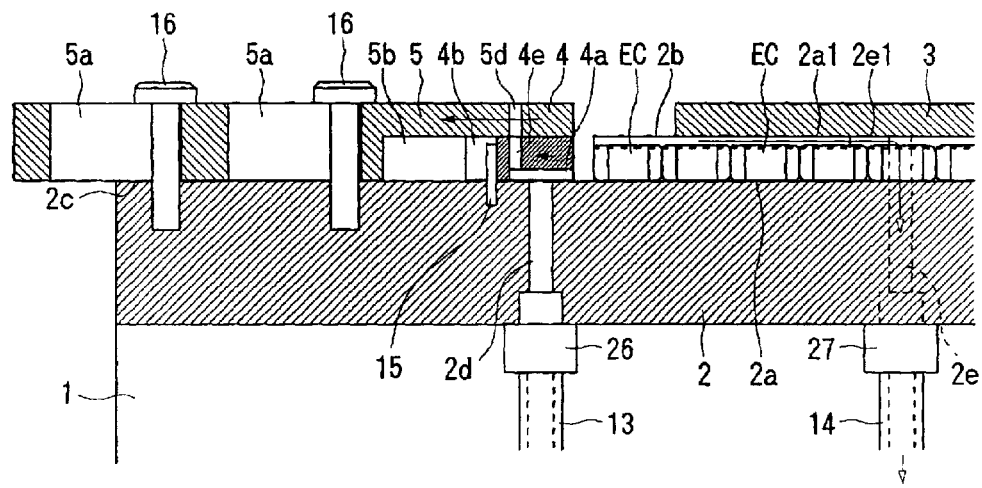
FIG. 21 is a view showing a state in which a shutter is advancing, according to a sixth embodiment of the present invention.
Figure 22:
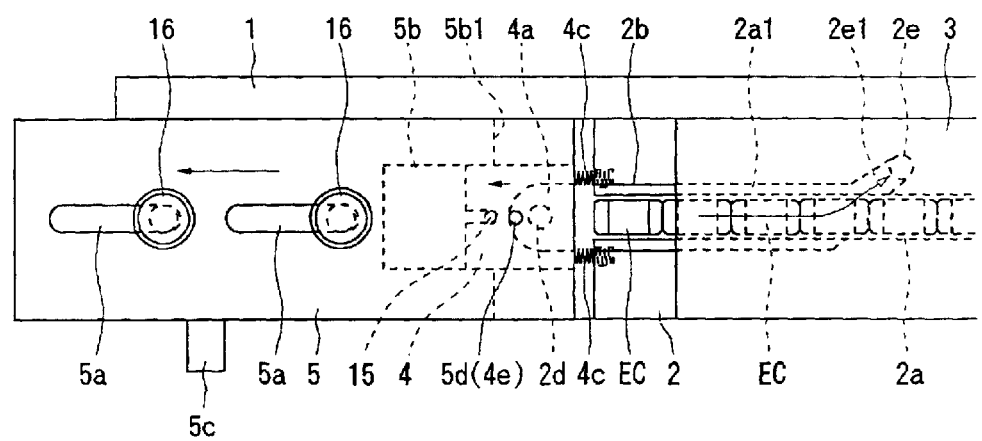
FIG. 22 is a top view of FIG. 21.

FIG. 21 and FIG. 22 show a sixth embodiment of the feeding apparatus to which the present invention is applied. The points in which this feeding apparatus differs from the feeding apparatus of the first embodiment are that an air vent hole 4e communicating with the airway 4a is formed in the component stopper 4, and that an air vent hole 5d, which communicates with the aforementioned air vent hole 4e when the shutter 5 advances to the predetermined component ejection port open position, is formed in the shutter 5.

According to the feeding apparatus of the sixth embodiment, even when residual pressure on the previous transfer of the components when negative air pressure for transferring the electronic components is exerted forward on the electronic components EC in the transfer passage 2a through the first air hole 2d and the airway 4a remains in the airway 4a and the first air hole 2d, at a point of time when the air vent hole 5d of the shutter 5 communicates with the air vent hole 4e of the component stopper 4, outside air is positively taken into the airway 4a and the first air hole 2d through the air vent holes 5d and 4d and the residual pressure can be eliminated. When the residual pressure is extremely large, it becomes a hindrance when the forefront electronic component EC is taken out with the suction nozzle, but in this case, the components can be also taken out favorably by positively eliminating the residual pressure.

Figure 23:
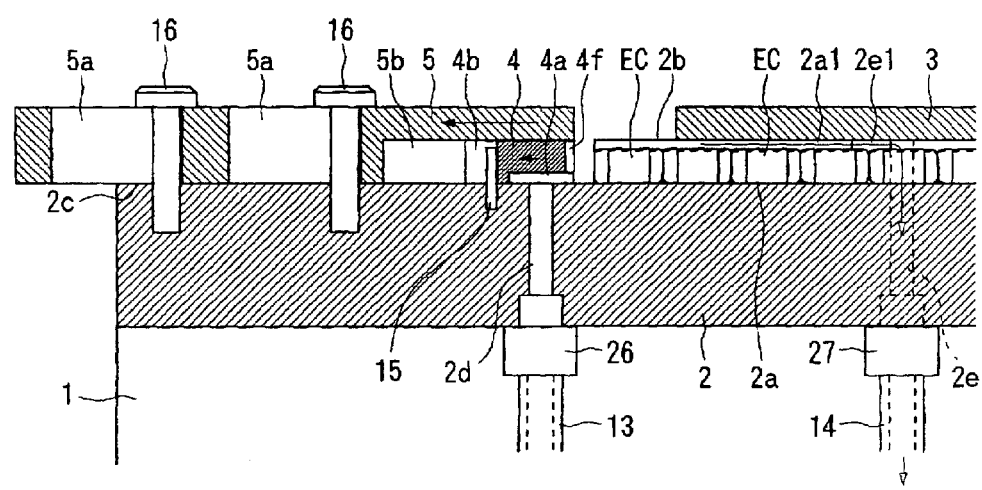
FIG. 23 is a view showing a modification example of an air vent hole shown in FIG. 21 and FIG. 22.

FIG. 21 and FIG. 22 show that the component stopper 4 and the shutter 5 are provided with the air vent holes respectively, but if an air vent channel 4f communicating with the airway 4a is provided in the rear end surface of the component stopper 4, and is used instead of the aforementioned air vent holes 5d and 4d as shown in FIG. 23, the same operational effects can be obtained.

Figure 24:
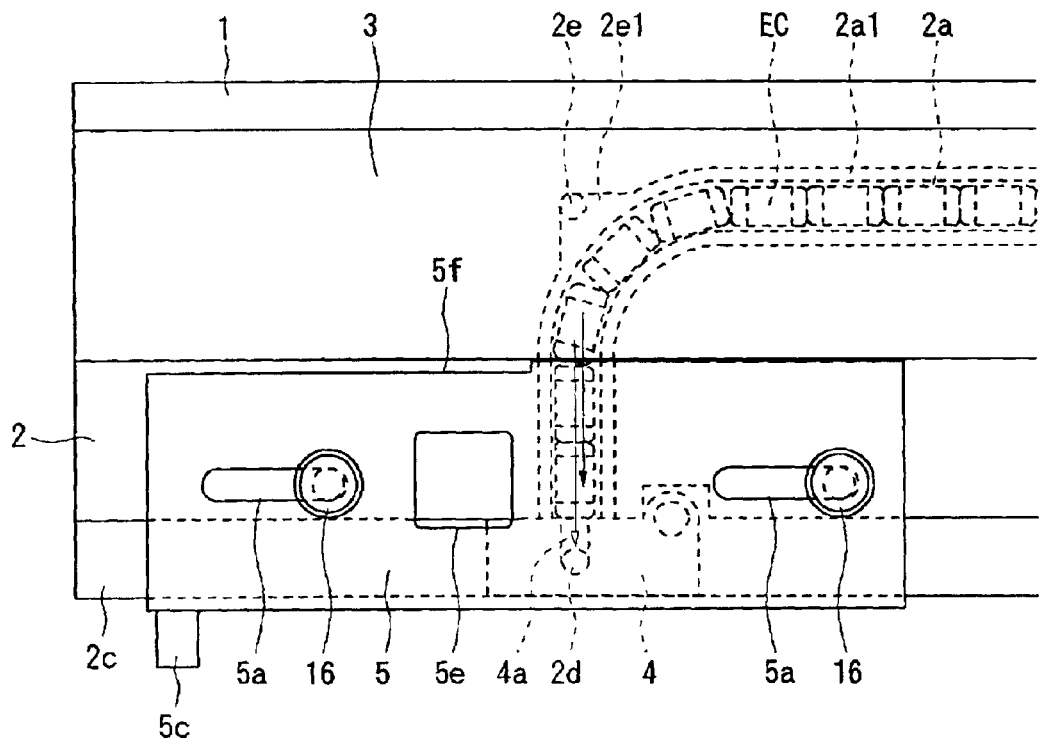
FIG. 24 is a view showing a state in which electronic components in a transfer passage are transferred, according to a seventh embodiment of the present invention.
Figure 25:
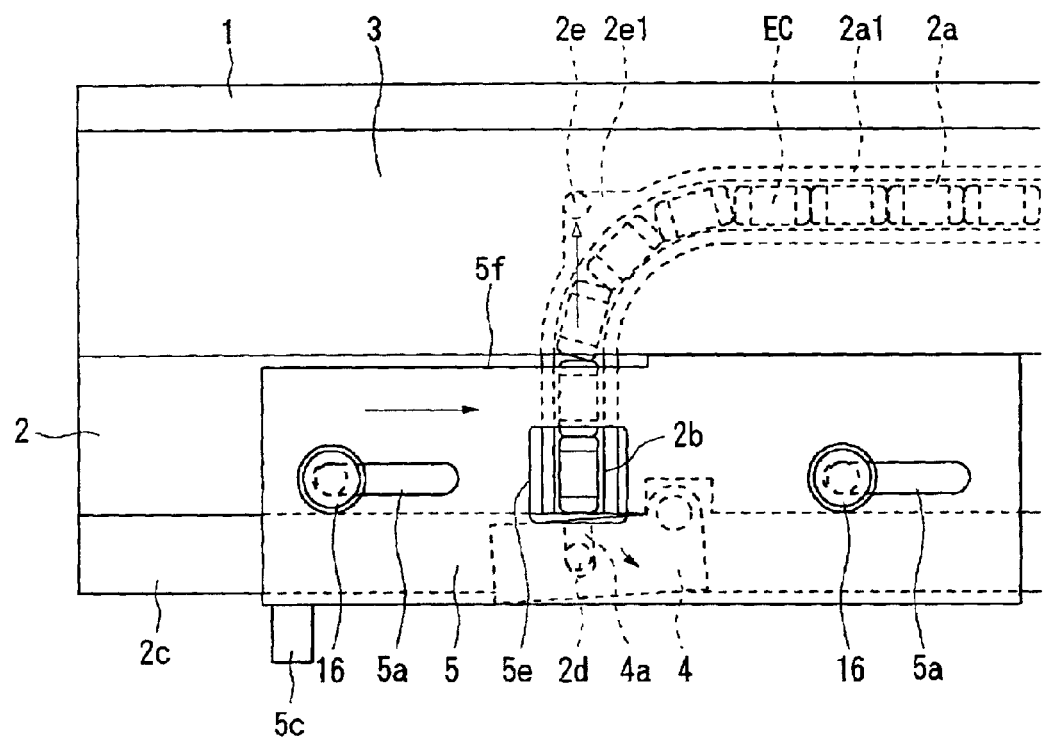
FIG. 25 is a view showing a state in which a shutter of a feeding apparatus shown in FIG. 24 is retreating.

FIG. 24 and FIG. 25 show a seventh embodiment of the feeding apparatus to which the present invention is applied. FIG. 24 corresponds to FIG. 10 of the first embodiment, and FIG. 25 corresponds to FIG. 6 and FIG. 7 of the first embodiment. In FIG. 24 and FIG. 25, the parts having the same names and functions as in the feeding apparatus of the first embodiment are given the same reference numerals and symbols.

The points in which this feeding apparatus differs from the feeding apparatus of the first embodiment are that a channel with a front part having a shape bent by 90 degrees is formed in a component guide 2 and is made a transfer passage 2a, that a second air hole 2e is formed at a right side position of the bent portion of the channel to communicate with the auxiliary flow passage 2a1 via a communication flow passage 2e1, that a recessed part 2c is formed at the left side of the component guide 2 and a first air hole 2d is formed in its bottom surface, that a component stopper 4 having an airway 4a is rotatably placed on a bottom surface of the recessed part 2c, that a shutter 5 having a window hole 5e is placed movably back and forth so as to cover a front part of the channel of the component guide 2, and that an air vent channel 5f is provided at a boarder portion of the shutter 5 and the cover 3.

In the feeding apparatus of the seventh embodiment, when the shutter 5 is at an advancing position, a front part (the component ejection port 2b) of the transfer passage 2a is covered with the shutter 5, and in the state in which the shutter 5 retreats and its window hole 5e corresponds to the front part (the component ejection port 2b) of the transfer passage 2a, the forefront electronic component EC can be taken out. The movement of the shutter 5 can be obtained if the orientation of the driven lever 8 of the feeding apparatus of the first embodiment is longitudinally reversed.

In the feeding apparatus of the seventh embodiment, the component stopper 4 abuts against a right side wall surface of the recessed part 2c when the shutter 5 is at the advancing position, and when the shutter 5 retreats, the component stopper 4 rotates in the counterclockwise direction and moves away from the right sidewall surface of the recessed part 2c. The movement of the component stopper 4 can be obtained by biasing the component stopper 4 in the clockwise direction by a spring material and by providing a pressing part, which can rotate the component stopper 4 in the counterclockwise direction, on a backside of the shutter 5.

According to the feeding apparatus of the seventh embodiment, the same component transfer as in the feeding apparatus of the first embodiment can be performed, and by exerting negative air pressure rightward mainly on the third electronic component EC in the transfer passage 2a through the second air hole 2e and the communication flow passage 2e1 to keep the following electronic components EC standing still on the spot, the component stopper 4 can be advanced from the component stop position to the separation position while the standing still state is maintained.

Even when residual pressure on the previous transferring of the components when negative air pressure is exerted on the electronic components EC in the transfer passage 2a through the first air hole 2d and the airway 4a remains in the airway 4a and the first air hole 2d, the air vent channel 5f of the shutter 5 reaches the transfer passage 2a earlier than the transfer window hole 5e, and outside air is positively taken into the airway 4a and the first air hole 2d through the air vent channel 5f, whereby the residual pressure can be eliminated. When the residual pressure is extremely large, it becomes a hindrance when the forefront electronic component EC is taken out by the suction nozzle, but in such a case, the components can be taken out favorably by positively eliminating the residual pressure.

Figure 26:
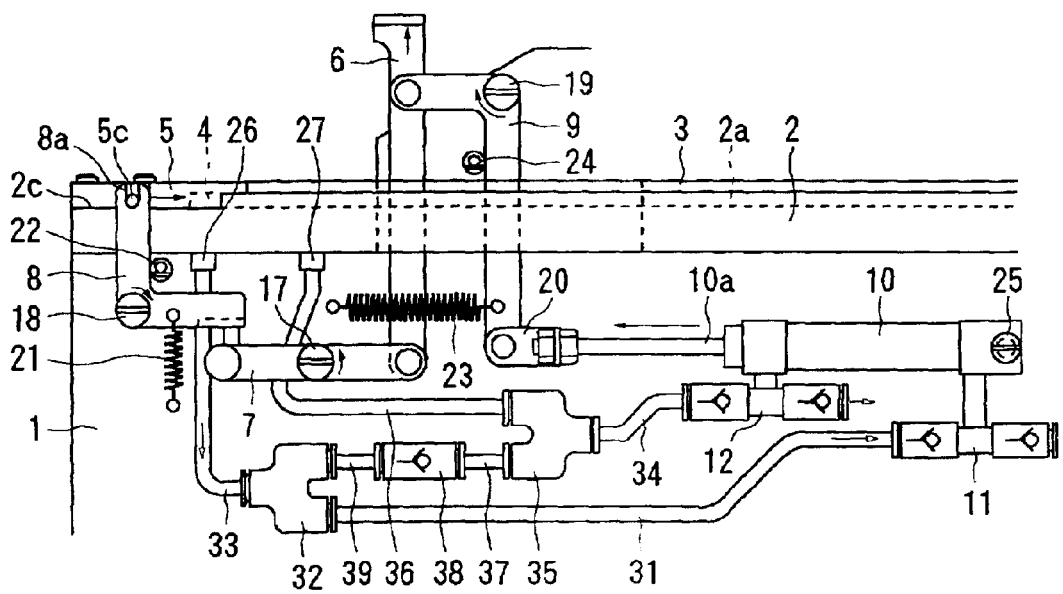
FIG. 26 is a left side view of a feeding apparatus showing a state in which an operation lever is at an ascending position, according to an eighth embodiment of the present invention.
Figure 27:
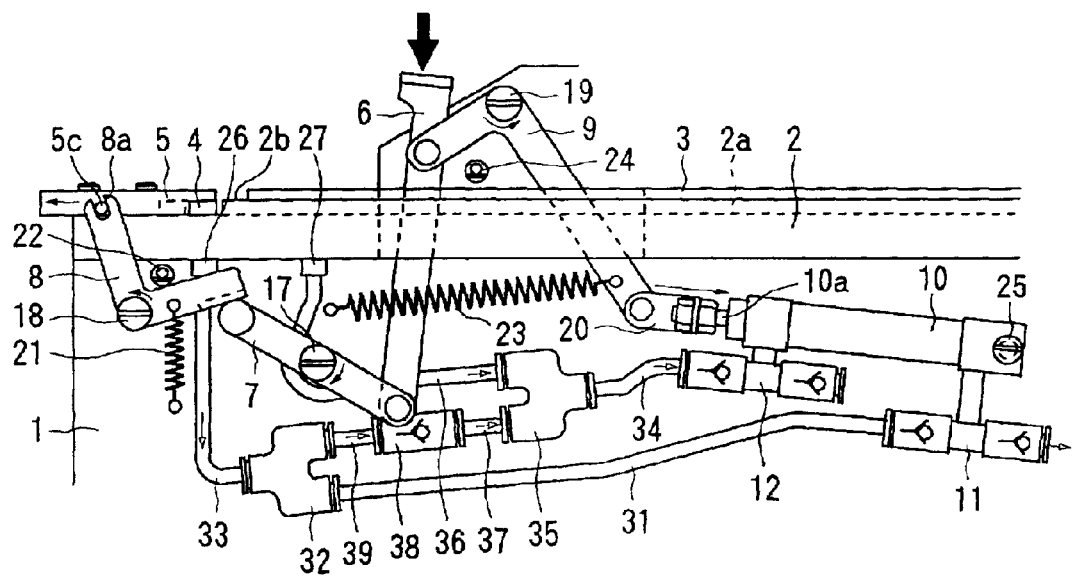
FIG. 27 is a left side view of the feeding apparatus showing a state in which the operation lever shown in FIG. 26 is at a descending position.
Figure 28:
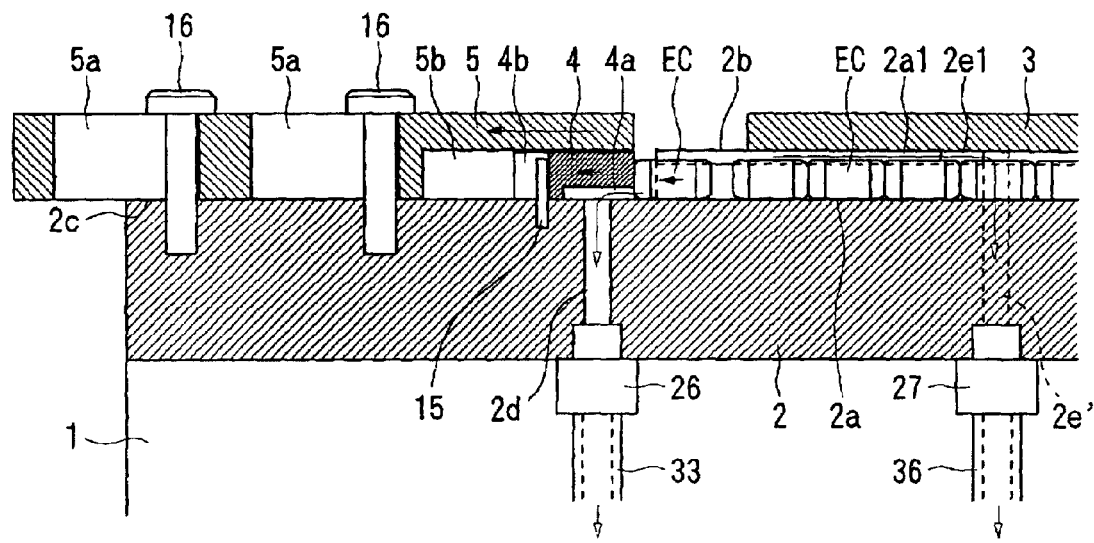
FIG. 28 is an essential part enlarged vertical longitudinal sectional view of FIG. 27.

FIG. 26 to FIG. 28 show an eighth embodiment of the feeding apparatus to which the present invention is applied. The points in which this feeding apparatus differs from the feeding apparatus of the first embodiment are that a rear end of an air tube 31 is connected to the front side port of the first control valve 11 and a front end of this air tube 31 is connected to one of divergent ports of a shunt device 32, then an inlet port of this shunt device 32 is connected to a rear end of an air tube 33, and a front end of this air tube 33 is connected to the first joint 26; and that a rear end of an air tube 34 is connected to the front side port of the second control valve 12, a front end of this air tube 34 is connected to a combined port of a flow combining device 35, a rear end of an air tube 36 is connected to one of inlet ports of this flow combining device 35, a front end of this air tube 36 is connected to the second joint 27; that a rear end of an air tube 37 is connected to the other inlet port of the flow combining device 35, a rear side port of a third control valve 38 is connected to a front end of this air tube 37, a rear end of an air tube 39 is connected to a front side port of the third control valve 38, and a front end of this air tube 39 is connected to the other divergent port of the shunt device 32. As understood from the valve marks shown in FIG. 26 and FIG. 27, the third control valve 38 allows only a flow of air from the front to the rear.

In the feeding apparatus of the eighth embodiment, when the operation lever 6 at the descending position is returned by releasing pushing-down force onto the operation lever 6 after the forefront electronic component EC is taken out, from the time when the rod 10a of the air cylinder 10 starts advancing until the rod 10a stops advancing, negative air pressure is exerted forward on the electronic components EC in the transfer passage 2a through the front side port of the first control valve 11, the air tube 31, the shunt device 32, the air tube 33, the first joint 26, the first air hole 2d and the airway 4a, and the electronic components EC in the transfer passage 2a are transferred forward in an aligned state as they are, whereby the forefront electronic component EC abuts against the component stopper 4 as shown in FIG. 26.

When the operation lever 6 at the ascending position is moved downward, negative air pressure is exerted rearward mainly on the second to the fourth electronic components EC in the transfer passage 2a through the front side port of the second control valve 12, the air tube 34, the flow combining device 35, the air tube 36, the second joint 27, the second air hole 2e and the communication flow passage 2e1 as shown in FIG. 27 and FIG. 28, whereby the pressing force exerted on the forefront electronic component EC abutting against the component stopper 4 from the following electronic components EC is relieved, and the following electronic components EC basically stand still, which includes the case in which they slightly retreat. Negative air pressure is exerted forward on the forefront electronic component EC in the transfer passage 2a through the front side port of the second control valve 12, the air tube 34, the flow combining device 35, the air tube 37, the third control valve 38, the air tube 39, the shunt device 32, the air tube 33, the first joint 26, the first air hole 2d and the airway 4a, and the forefront electronic component EC is attracted to the component stopper 4.

According to the feeding apparatus of the eighth embodiment, the forefront electronic component EC abutting against the component stopper 4 can be attracted to the component stopper 4 by negative air pressure when the component stopper 4 advances, and therefore the forefront electronic component EC is advanced with the component stopper 4 when the component stopper 4 advances, whereby the forefront electronic component EC can be positively separated from the following electronic components EC.

Figure 29:
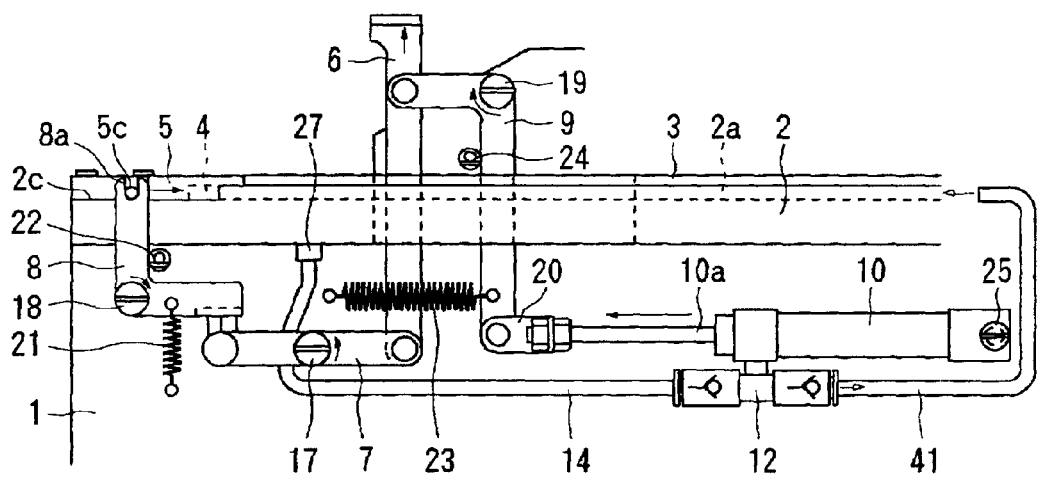
FIG. 29 is a left side view of a feeding apparatus showing a state in which an operation lever is at an ascending position, according to a ninth embodiment of the present invention.

FIG. 29 shows a ninth embodiment of the feeding apparatus to which the present invention is applied. The points in which this feeding apparatus differs from the feeding apparatus of the first embodiment are that the first control valve 11, the first air tube 12, the first joint 26, the first air hole 2d and the airway 4a of the component stopper 4 are eliminated; that the air supply and exhaust port at the rear side of the the air cylinder 10 is blocked; that an air hole (not shown) corresponding to the first air hole 2d is provided at the rear side of the transfer passage 2a; and that the rear side port of the second control valve 12 is connected to the air hole at the rear side of the transfer passage 2a via another air tube 41.

According to the feeding apparatus of the ninth embodiment, positive air pressure for transferring the electronic components is exerted forward on the electronic components EC in the transfer passage 2a through the air hole at the rear side of the transfer passage 2a when the rod 10a of the air cylinder 10 advances, and thereby the same component transfer as in the feeding apparatus of the first embodiment can be carried out.

Figure 30:
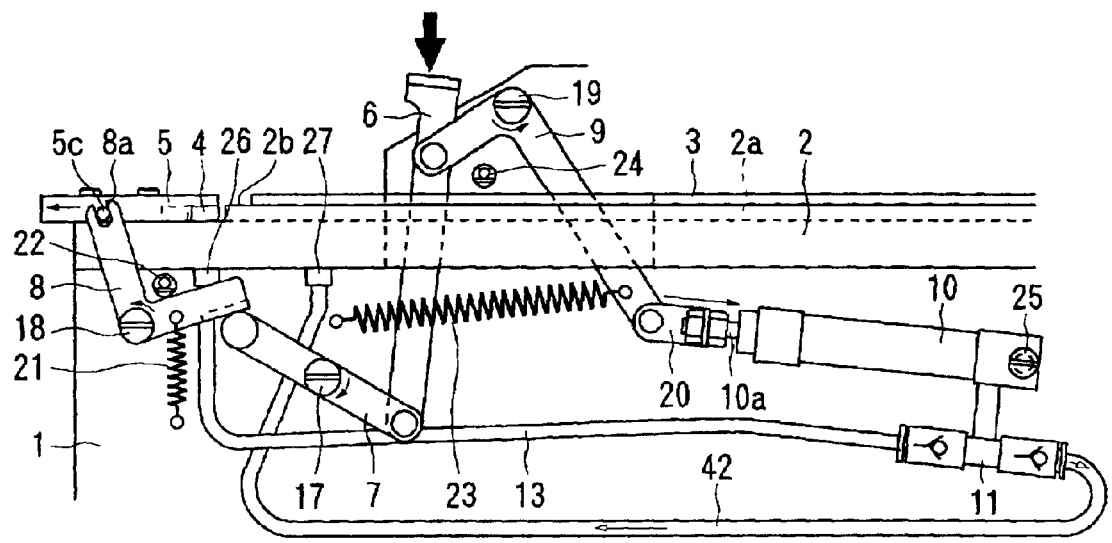
FIG. 30 is a left side view of a feeding apparatus showing a state in which an operation lever is at an ascending position, according to a tenth embodiment of the present invention.
Figure 31:
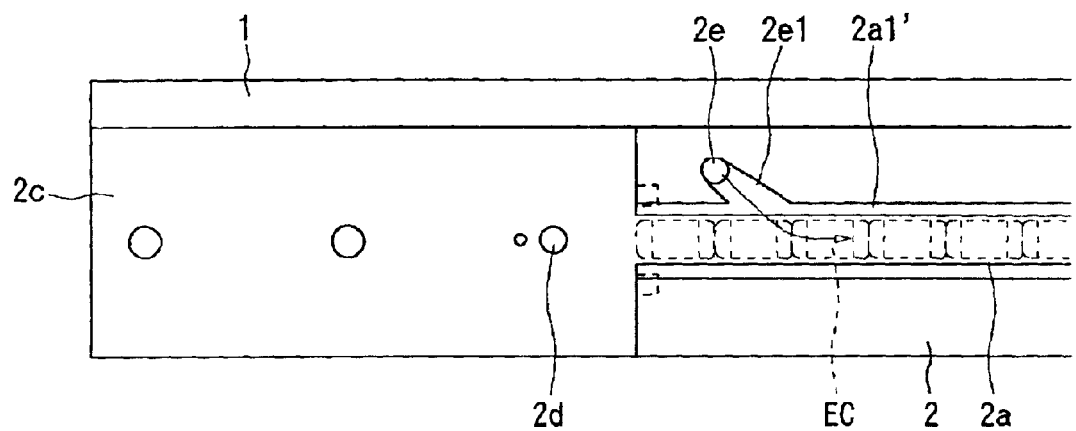
FIG. 31 is an essential part enlarged top view excluding a cover, a stopper, a shutter, a positioning pin and a guide pin of FIG. 30.

FIG. 30 and FIG. 31 show a tenth embodiment of the feeding apparatus to which the present invention is applied. The points in which this feeding apparatus differs from the feed device of the first embodiment are that the second control valve 12 and the second air tube 14 are eliminated; that the air supply and exhaust port at the front side of the air cylinder 10 is blocked; that the rear side port of the first control valve 11 is connected to the second joint 27 via another air tube 42; that a groove with a rectangular longitudinal section to be the auxiliary flow passage 2a1' is extended to the rear; and that the position of the second air hole 2e is displaced to the front, and that with use of this second air hole 2e as a air blow hole and its upper end communicates with the right side groove through the communication flow passage 2e1 facing obliquely rearward.

According to the feeding apparatus of the tenth embodiment, positive air pressure is exerted rearward mainly on the second electronic component EC in the transfer passage 2a through the air blow hole and the communication flow passage 2e1 when the rod 10a of the air cylinder 10 retreats, whereby the following electronic components EC can be kept standing still on the spot, and the same operational effects as in the feeding apparatus of the first embodiment can be obtained.

Figure 32:
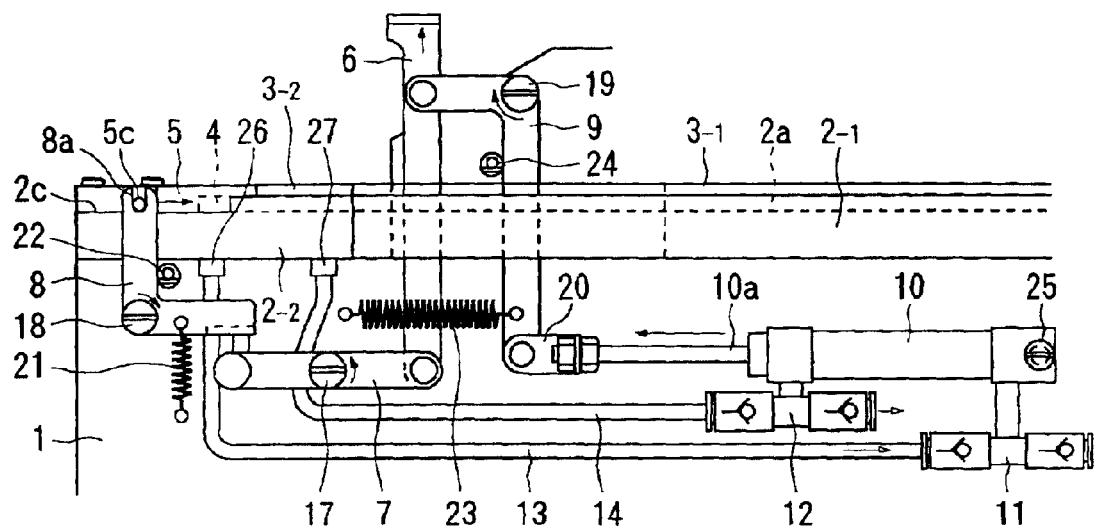
FIG. 32 is a left side view of a feeding apparatus showing a state in which an operation lever is at an ascending position, according to an eleventh embodiment of the present invention.

FIG. 32 shows an eleventh embodiment of the feeding apparatus to which the present invention is applied. The point in which this feeding apparatus differs from the feeding apparatus of the first embodiment is that the component guide 2 and the cover 3 are constructed to be separable at the rear side of the second joint 27, and a mechanism part including a front side component guide 2-1 and a front side cover 3-1 is unitized. The unitized mechanism part includes at least the front side component guide 2-1 and the front side cover 3-1, the component stopper 4, the shutter 5, the positioning pin 15 and the guide pin 16.

According to the feeding apparatus of the eleventh embodiment, the unitized mechanism part can be separately assembled, and therefore the feeding apparatus shown in the first embodiment can be assemble easily. In addition, the unitized mechanism part can be removed from the feeding apparatus or replaced with other one, and therefore maintenance can be facilitated. Further, only the unitized mechanism part can be on the market.

Figure 33:
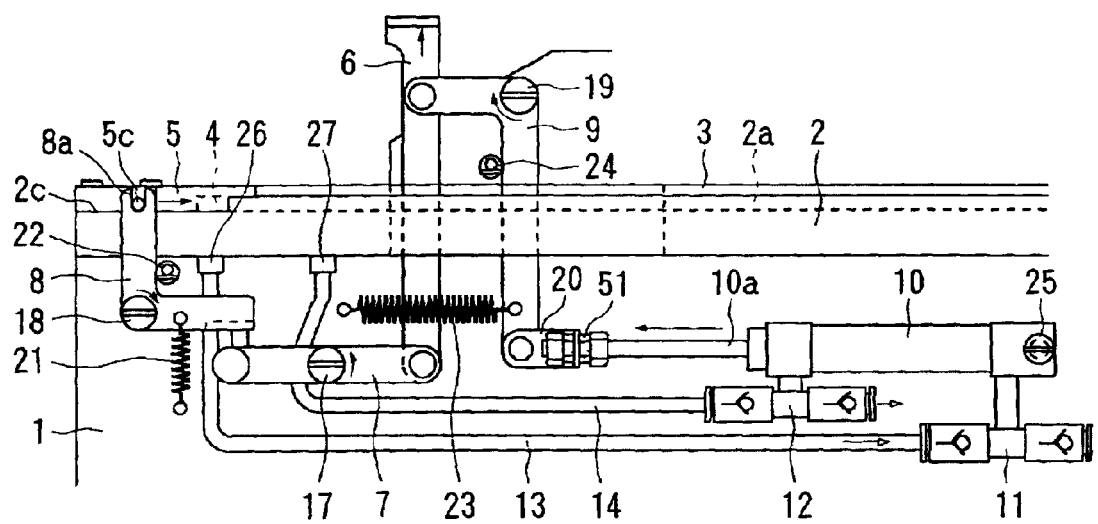
FIG. 33 is a left side view of a feeding apparatus showing a state in which an operation lever is at an ascending position, according to a twelfth embodiment of the present invention.

FIG. 33 shows a twelfth embodiment of the feeding apparatus to which the present invention is applied. The point in which this feeding apparatus differs from the feeding apparatus of the first embodiment is that a transformable absorbing member 51 composed of a rubber push, a coil spring, or the like is fitted onto a connecting portion of the rod 10a of the air cylinder 10 and the connecting plate 20.

According to the feeding apparatus of the twelfth embodiment, addition of a load to the upper portion of the rod 10a due to the inclination of the air cylinder 10 at the time of the rod 10a moving back and forth is relieved by the aforementioned transformable absorbing member 51, and one-side abrasion is prevented from occurring to the upper portion of the rod 10a due to the aforementioned load, whereby durability can be improved.

In the feeding apparatuses in the first to the twelfth embodiment, it is shown that the electronic components EC each in a square pole form having the dimensional relationship of the length dimension>the width dimension=the height dimension are transferred, however, by appropriately adjusting the dimensions of the areas where the components pass, electronic components in a square pole form having the dimensional relationship of the length dimension>the width dimension>the height dimension, electronic components in a cylindrical form, or electronic components having three-dimensional forms differing from a square form and a cylindrical form can be also dealt as objects to be transferred, In each of the feeding apparatuses in the first to the twelfth embodiment, a linear type of air cylinder including two air supply and exhaust ports is used as the air cylinder 10, however, a rotary type of air cylinder may be used instead of it.

In each of the feeding apparatuses in the first to the twelfth embodiment, the air cylinder 10 operated by the lever mechanism is shown as a source of negative or positive air pressure, however, an air actuator other than the air cylinder, for example, an elastically deformable air tank or air bag, a mechanical pump or the like may be used instead thereof, as long as it can generate negative or positive air pressure by the operation by means of a lever mechanism.

The preferred embodiments described in this specification are illustrative and not restrictive. The scope of the invention is indicated by the appended claims, and all changes that come within the meaning of the claims are therefore intended to be embraced in the present invention.

What is claimed is:

1. A component feeding method of transferring electronic components forward in alignment along a transfer passage such that a forefront electronic component abuts against a component stopper in order to take the forefront electronic component outside through a component ejection port, comprising:
   exerting air pressure for relieving pressing force rearward on at least one of following electronic components when the forefront electronic component is taken outside through the component ejection port;
   using a shutter movable between a component ejection port closed position and a component ejection port open position which is away from the component ejection port closed position;
   moving the shutter from the component ejection port closed position to the component ejection port open position, before the forefront electronic component is taken outside through the component ejection port; and
   exerting the air pressure for relieving the pressing force when the shutter is moved from the component ejection port closed position to the component ejection port open position.

2. The component feeding method according to claim 1, wherein:
   the air pressure for relieving the pressing force is exerted mainly on a second electronic component or a plurality of electronic components including the second electronic component.

3. The component feeding method according to claim 1, wherein:
   the air pressure for relieving the pressing force is negative air pressure.

4. The component feeding method according to claim 1, wherein:
   the air pressure for relieving the pressing force is positive air pressure.

5. A component feeding method of transferring electronic components forward in alignment along a transfer passage such that a forefront electronic component abuts against a component stopper in order to take the forefront electronic component outside through a component ejection port, comprising:
   exerting air pressure for relieving pressing force rearward on at least one of following electronic components when the forefront electronic component is taken outside through the component ejection port;
   using a shutter movable between a component ejection port closed position and a component ejection port open position which is away from the component ejection port closed position;
   using a component stopper movable between a component stop position and a separation position which is away from the component stop position as said component stopper;
   moving the shutter from the component ejection port closed position to the component ejection port open position and moving the component stopper from the component stop position to the separation position, before the forefront electronic component is taken outside through the component ejection port; and
   exerting the air pressure for relieving the pressing force when the shutter is moved from the component ejection port closed position to the component ejection port open position and the component stopper is moved from the component stop position to the separation position.

6. The component feeding method according to claim 5, wherein:
   the air pressure for relieving the pressing force is exerted mainly on a second electronic component or a plurality of electronic components including the second electronic component.

7. The component feeding method according to claim 5, wherein:
   the air pressure for relieving the pressing force is negative air pressure.

8. The component feeding method according to claim 5, wherein:
   the air pressure for relieving the pressing force is positive air pressure.

9. A component feeding method of transferring electronic components forward in alignment along a transfer passage such that a forefront electronic component abuts against a component stopper in order to take the forefront electronic component outside through a component ejection port, comprising:
   exerting air pressure for relieving pressing force rearward on at least one of following electronic components when the forefront electronic component is taken outside through the component ejection port;
   using a shutter movable between a component ejection port closed position and a component ejection port open position which is away from the component ejection port closed position; and
   exerting air pressure for transferring the electronic components forward on the electronic components in a state where the transfer passage when the component ejection port was closed by the shutter.

10. The component feeding method according to claim 9, wherein:
    the air pressure for transferring the electronic components is negative air pressure.

11. The component feeding method according to claim 9, wherein:
the air pressure for transferring the electronic components is positive air pressure.

12. The component feeding method according to claim 9, wherein:
the air pressure for relieving the pressing force is exerted mainly on a second electronic component or a plurality of electronic components including the second electronic component.

13. The component feeding method according to claim 9, wherein:
the air pressure for relieving the pressing force is negative air pressure.

14. The component feeding method according to claim 9, wherein:
the air pressure for relieving the pressing force is positive air pressure.

15. A component feeding apparatus including a transfer passage for transferring electronic components forward in alignment, a component stopper against which a forefront electronic component abuts, and a component ejection part for taking the forefront electronic component outside, comprising:
an air hole for exerting air pressure for relieving pressing force rearward on at least one of following electronic components when the forefront electronic component is taken outside through the component ejection port;
an air actuator capable of generating negative air pressure or positive air pressure, the air actuator being connected to the air hole for relieving the pressing force;
a drive for operating the air actuator so that air pressure for relieving the pressing force is exerted rearward on at least one of the following electronic components in response to the forefront electronic component being taken outside through the component ejection port;
a shutter movable between a component ejection port closed position and a component ejection port open position which is away from the component ejection port closed position;
a component stopper movable between a component stop position and a separation position which is away from the component stop position, which is used as said component stopper; and
a drive for moving the shutter from the component ejection port closed position to the component ejection port open position and for moving the component stopper from the component stop position to the separation position, in a step before the forefront electronic component is taken outside through the component ejection port.

16. The component feeding apparatus according to claim 15, wherein:
the air hole is formed at a position at which the air pressure for relieving the pressing force is exerted on the second electronic component or a plurality of electronic components including the second electronic component.

17. The component feeding apparatus according to claim 15, wherein:
the air hole is formed at a position away from the transfer passage, and an upper end thereof communicates with the transfer passage through a communication flow passage.

18. The component feeding apparatus according to claim 15, wherein:
the air actuator is an air cylinder capable of generating negative air pressure or positive air pressure by rod drive.

19. A component feeding apparatus including a transfer passage for transferring electronic components forward in alignment, a component stopper against which a forefront electronic component abuts, and a component ejection port for taking the forefront electronic component outside, comprising:
an air hole for exerting air pressure for relieving pressing force rearward on at least one of following electronic components when the forefront electronic component is taken outside through the component ejection port;
a shutter movable between a component ejection port closed position and a component ejection port open position which is away from the component ejection port closed position; and
a second air hole for exerting air pressure for transferring the electronic components forward on the electronic components in the transfer passage in a state where the component ejection port was closed by the shutter.

20. The component feeding apparatus according to claim 19, wherein:
the second air hole for transferring the electronic components is at a front side or a rear side of the transfer passage.

21. The component feeding apparatus according to claim 19, further comprising:
an air actuator capable of generating negative air pressure or positive air pressure, the air actuator being connected to the air hole for relieving the pressing force and the second air hole for transferring the electronic components.

22. The component feeding apparatus according to claim 21, wherein:
the air actuator is an air cylinder capable of generating negative air pressure or positive air pressure by rod drive.

23. The component feeding apparatus according to claim 21, further comprising:
a drive for operating the air actuator so that the air pressure for transferring the electronic components is exerted forward on the electronic components in the transfer passage when the electronic components in alignment is transferred forward, and for operating the air actuator so that the air pressure for relieving the pressing force is exerted rearward on at least one of the following electronic components in response to the forefront electronic component being taken outside through the component ejection port.

24. The component feeding apparatus according to claim 23, further comprising:
the component stopper being movable to a component stop position and a separation position which is away from the component stop position, which is used as said component stopper; and
a second drive for moving the shutter from the component ejection port closed position to the component ejection port open position and for moving the component stopper from the component stop position to the separation position, in a step before the forefront electronic component is taken outside through the component ejection port.

25. The component feeding apparatus according to claim 19, wherein:
the air hole is formed at a position at which the air pressure for relieving the pressing force is exerted on the second electronic component or a plurality of electronic components including the second electronic component.

26. The component feeding apparatus according to claim 19, wherein:
the air hole is formed at a position away from the transfer passage, and an upper end thereof communicates with the transfer passage through a communication flow passage.

27. A component feeding unit, comprising:
a component guide having a linear channel for a transfer passage;
a cover for covering a top surface of a part where the linear channel of the component guide is formed except for a front portion by which a component ejection port from which an forefront electronic component is taken outside is constituted;
a component stopper movable to a component stop position in contact with a front end surface of the linear channel and to a separation position which is away from the component stop position;
a shutter movable to a component ejection port closed position with the component ejection port being covered and to a component ejection port open position which is away from the component ejection port closed position;
a first air hole for transferring electronic components, formed forward from the front end of the linear channel and communicating with the transfer passage; and
a second air hole for relieving pressing force, formed rearward from the front end of the linear channel and communicating with the transfer passage.

28. The component feeding unit according to claim 27, wherein:
the first air hole is an air hole for exerting air pressure for transferring the electronic components forward on the electronic components in the transfer passage in a state where the component ejection port was closed by the shutter; and
the second air hole is an air hole for exerting air pressure for relieving the pressing force rearward on at least one of following electronic components when the forefront electronic component is taken out through the component ejection port.

29. The component feeding unit according to claim 27, further comprising:
a spring material for biasing the component stopper from the component stop position to the separation position, wherein the component stopper is capable of moving from the component stop position to the separation position by force of the spring material when the shutter moves from the component ejection port closed position to the component ejection port open position, and the component stopper is capable of moving from the separation position to the component stop position against the force of the spring material when the shutter moves from the component ejection port open position to the component ejection port closed position.

30. A component feeding method of transferring components forward in alignment along a transfer passage such that a forefront component abuts against a component stopper in order to take the forefront component outside through a component ejection port, comprising:
exerting air pressure for relieving pressing force rearward on at least one of following components when the forefront component is taken outside through the component ejection port;
using a shutter movable between a component ejection port closed position and a component ejection port open position which is away from the component ejection port closed position;
moving the shutter from the component ejection port closed position to the component ejection port open position, before the forefront component is taken outside through the component ejection port; and
exerting the air pressure for relieving the pressing force when the shutter is moved from the component ejection port closed position to the component ejection port pen position.

31. A component feeding method of transferring components forward in alignment along a transfer passage such that a forefront component abuts against a component stopper in order to take the forefront component outside through a component ejection port, comprising:
exerting air pressure for relieving pressing force rearward on at least one of following components when the forefront component is taken outside through the component ejection port;
using a shutter movable between a component ejection port closed position and a component port open position which is away from the component port closed position;
using a component stopper movable between a component stop position and a separation position which is away from the component stop position as said component stopper;
moving the shutter from the component ejection port closed position to the component ejection port open position and moving the component stopper from the component stop position to the separation position, before the forefront component is taken outside through the component ejection port; and
exerting the air pressure for relieving the pressing force when the shutter is moved from the component ejection port closed position to the component ejection port open position and the component stopper is moved from the component stop position to the separation position.

32. A component feeding method of transferring components forward in alignment along a transfer passage such that a forefront component abuts against a component stopper in order to take the forefront component outside through a component ejection port, comprising:
exerting air pressure for relieving pressing force rearward on at least one of following components when the forefront component is taken outside through the component ejection port;
using a shutter movable between a component ejection port closed position and a component ejection port open position which is away from the component ejection port closed position; and
exerting air pressure for transferring the components forward on the components in a state where the transfer passage when the component ejection port was closed by the shutter.

33. A component feeding apparatus including a transfer passage for transferring components forward in alignment, a component stopper against which a forefront component abuts, and a component ejection port for taking the forefront component outside, comprising:

an air hole for exerting air pressure for relieving pressing force rearward on at least one of following components when the forefront component is taken outside through the component ejection port;

an air actuator capable of generating negative air pressure or positive air pressure, the air actuator being connected to the air hole for relieving the pressing force;

a drive for operating the air actuator so that air pressure for relieving the pressing force is exerted rearward on at least one of the following components in response to the forefront component being taken outside through the component ejection port;

a shutter movable between a component ejection port closed position and a component ejection port open position which is away from the component ejection port closed position;

a component stopper movable between a component stop position and a separation position which is away from the component stop position, which is used as said component stopper; and a drive for moving the shutter from the component ejection port closed position to the component ejection port open position and for moving the component stopper from the component stop position to the separation position, in a step before the forefront component is taken outside through the component ejection port.

34. A component feeding apparatus including a transfer passage for transferring components forward in alignment, a component stopper against which a forefront component abuts, and a component ejection port for taking the forefront component outside, comprising:

an air hole for exerting air pressure for relieving pressing force rearward on at least one of components when the forefront component is taken outside through the component ejection port;

a shutter movable between a component ejection port closed position and a component ejection port open position which is away from the component ejection port closed position; and a second air hole for exerting air pressure for transferring the components forward on the components in the transfer passage in a state where the component ejection port was closed by the shutter.

* * * * *